United States Patent
Balakrishnan et al.

(10) Patent No.: US 8,947,944 B2
(45) Date of Patent: Feb. 3, 2015

(54) PROGRAM CYCLE SKIP EVALUATION BEFORE WRITE OPERATIONS IN NON-VOLATILE MEMORY

(71) Applicant: SanDisk 3D LLC, Milpitas, CA (US)

(72) Inventors: Gopinath Balakrishnan, Santa Clara, CA (US); Tz-Yi Liu, Palo Alto, CA (US); Henry Zhang, Saratoga, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/839,366

(22) Filed: Mar. 15, 2013

(65) Prior Publication Data

US 2014/0269106 A1 Sep. 18, 2014

(51) Int. Cl.
*G11C 7/10* (2006.01)
*G11C 7/06* (2006.01)

(52) U.S. Cl.
CPC ............... *G11C 7/06* (2013.01); *G11C 7/1087* (2013.01)
USPC ............ 365/189.05; 365/201; 365/233.1; 365/191; 365/189.07

(58) Field of Classification Search
CPC ............... G11C 16/0483; G11C 16/08; G11C 16/3454; G11C 16/3459; G11C 11/005; G11C 29/36; G11C 29/026; G11C 29/789; G11C 2029/1204; H04L 49/25; G06F 12/0246; G06F 12/1416; G06F 9/3851; G06F 21/79; G06F 9/3814; G06F 9/30145
USPC .................. 365/154, 185.03, 185.11, 185.17, 365/185.22, 185.23, 207, 189.05, 201, 233; 707/E17.005; 711/154, 170
See application file for complete search history.

(56) References Cited

U.S. PATENT DOCUMENTS

| | | | |
|---|---|---|---|
| 4,926,312 A | 5/1990 | Nukiyama | |
| 5,890,192 A | 3/1999 | Lee | |
| 6,029,226 A | 2/2000 | Ellis | |

(Continued)

FOREIGN PATENT DOCUMENTS

| EP | 1282134 | 2/2003 |
|---|---|---|
| WO | WO2006/130438 | 12/2006 |

(Continued)

OTHER PUBLICATIONS

U.S. Appl. No. 13/839,300, filed Mar. 15, 2013.

(Continued)

*Primary Examiner* — Thong Q Le
(74) *Attorney, Agent, or Firm* — Vierra Magen Marcus LLP

(57) ABSTRACT

A non-volatile memory system is disclosed that evaluates during a read before write operation whether to skip programming of portions of group of memory cells during a subsequent write operation. By evaluating skip information during a read before write operation, the write operation can be expedited. The additional overhead for evaluating skip information is consumed during the read before write operation. By performing a skip evaluation during the read before write operation, a full analysis of the availability of skipping programming for memory cells can be performed. Skip evaluations in different embodiments may be performed for entire bay address cycles, column address cycles, and/or sense amplifier address cycles. In some embodiments, some skip evaluations are performed during read before write operations while others are deferred to the write operation. In this manner, the number of data latches for storing skip information can be decreased.

27 Claims, 21 Drawing Sheets

(56) References Cited

U.S. PATENT DOCUMENTS

| | | |
|---|---|---|
| 6,201,738 B1 | 3/2001 | Hebishima |
| 6,735,104 B2 | 5/2004 | Scheuerlein |
| 7,111,140 B2 | 9/2006 | Estakhri |
| 7,142,471 B2 | 11/2006 | Fasoli |
| 7,219,271 B2 | 5/2007 | Kleveland et al. |
| 7,243,203 B2 | 7/2007 | Scheuerlein |
| 7,383,476 B2 | 6/2008 | Crowley |
| 7,424,593 B2 | 9/2008 | Estakhri |
| 7,490,283 B2 | 2/2009 | Gorobets |
| 7,499,366 B2 | 3/2009 | Scheuerlein |
| 7,502,260 B2 | 3/2009 | Li |
| 7,545,689 B2 | 6/2009 | Ilkbahar et al. |
| 7,685,376 B2 * | 3/2010 | Zimmer et al. ............. 711/154 |
| 7,804,724 B2 | 9/2010 | Way |
| 7,966,532 B2 | 6/2011 | Bottelli et al. |
| 8,004,926 B2 | 8/2011 | Sutardja et al. |
| 8,213,243 B2 | 7/2012 | Balakrishnan et al. |
| 8,223,525 B2 | 7/2012 | Balakrishnan et al. |
| 8,374,051 B2 | 2/2013 | Yan et al. |
| 8,397,024 B2 | 3/2013 | Fasoli et al. |
| 2001/0005876 A1 | 6/2001 | Srinivasan |
| 2001/0017798 A1 | 8/2001 | Ishii |
| 2002/0041527 A1 | 4/2002 | Tanaka |
| 2002/0136045 A1 | 9/2002 | Scheuerlein |
| 2004/0188714 A1 | 9/2004 | Scheuerlein |
| 2004/0190360 A1 | 9/2004 | Scheuerlein |
| 2004/0250183 A1 | 12/2004 | Crowley |
| 2004/0255088 A1 | 12/2004 | Scheuerlein |
| 2006/0077720 A1 | 4/2006 | Im |
| 2006/0146639 A1 | 7/2006 | Fasoli |
| 2007/0147133 A1 | 6/2007 | Im |
| 2008/0151637 A1 | 6/2008 | Doyle |
| 2009/0161474 A1 | 6/2009 | Scheuerlein |
| 2009/0244987 A1 | 10/2009 | Cernea |
| 2010/0046267 A1 | 2/2010 | Yan |
| 2010/0146189 A1 | 6/2010 | Otterstedt et al. |
| 2010/0265750 A1 | 10/2010 | Yan |
| 2011/0047330 A1 | 2/2011 | Potapov et al. |
| 2011/0141788 A1 * | 6/2011 | Balakrishnan et al. ......... 365/51 |
| 2011/0141832 A1 * | 6/2011 | Balakrishnan et al. .. 365/189.16 |
| 2012/0275210 A1 | 11/2012 | Yan et al. |

FOREIGN PATENT DOCUMENTS

| | | |
|---|---|---|
| WO | WO2012/118618 A1 | 9/2012 |
| WO | WO2012/129083 A1 | 9/2012 |

OTHER PUBLICATIONS

International Search Report & The Written Opinion of the International Searching Authority dated Jun. 23, 2014, International Application No. PCT/US2014/019740.

* cited by examiner

US 8,947,944 B2

PROGRAM CYCLE SKIP EVALUATION BEFORE WRITE OPERATIONS IN NON-VOLATILE MEMORY

BACKGROUND

1. Field of the Invention

Embodiments of the present disclosure are directed to high density semiconductor devices, such as non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

DETAILED DESCRIPTION

A non-volatile memory system is disclosed that evaluates during a read before write operation whether to skip programming of portions of group of memory cells during a subsequent write operation. By evaluating skip information during a read before write operation, the write operation can be expedited. The additional overhead for evaluating skip information is consumed during the read before write operation. By performing a skip evaluation during the read before write operation, a full analysis of the availability of skipping programming for memory cells can be performed. Skip evaluations in different embodiments may be performed for entire bay address cycles, column address cycles, and/or sense amplifier address cycles. In some embodiments, some skip evaluations are performed during read before write operations while others are deferred to the write operation. In this manner, the number of data latches for storing skip information can be decreased.

Figure 1:
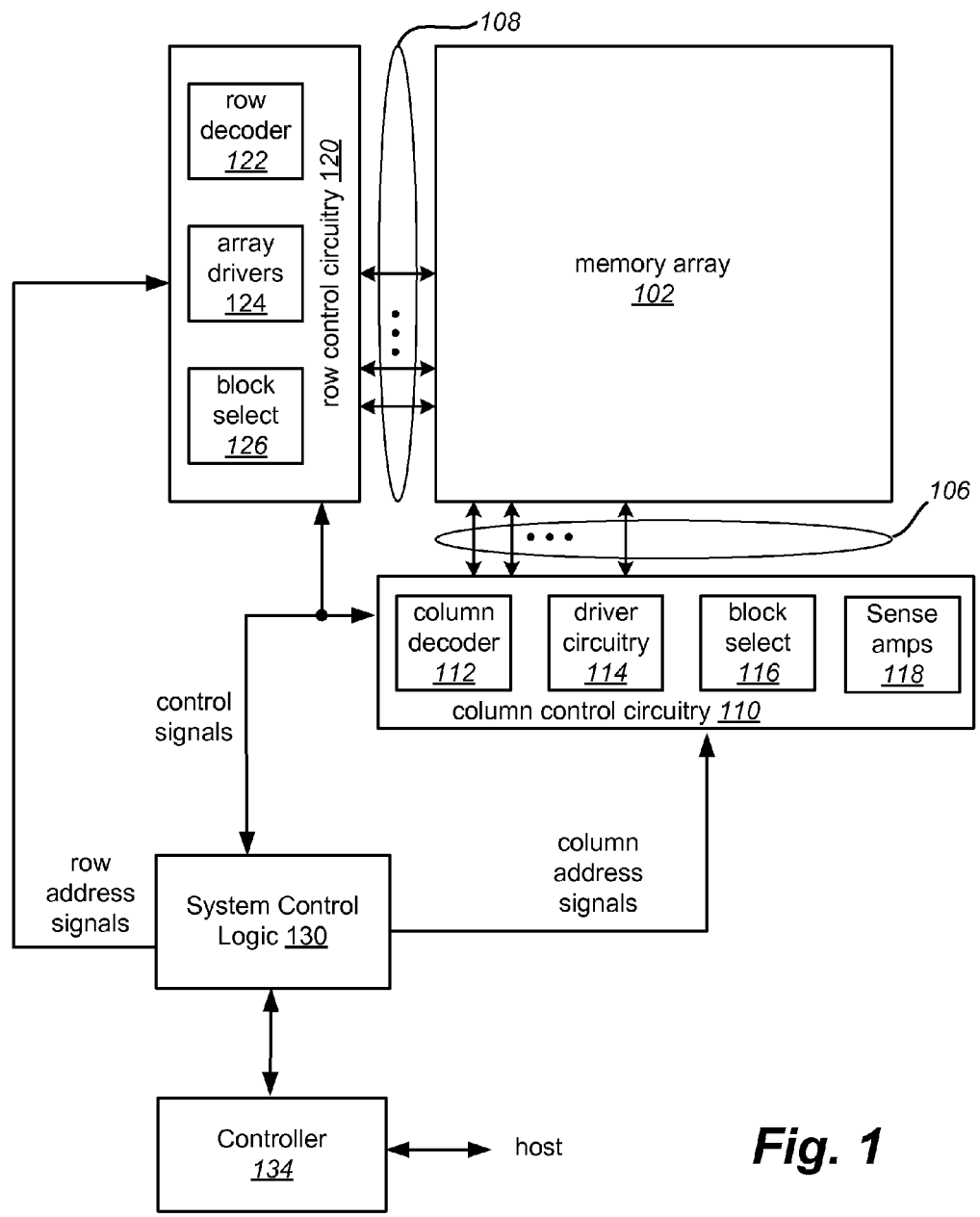
FIG. 1 is a block diagram of one embodiment of a memory system.

FIG. 1 is a block diagram that depicts one example of a memory system 100 that can implement the technology described herein. Memory system 100 includes a memory array 102, which can be a two or three dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133 and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. More information about suitable embodiments like that of FIG. 1 can be found in the following United States Patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
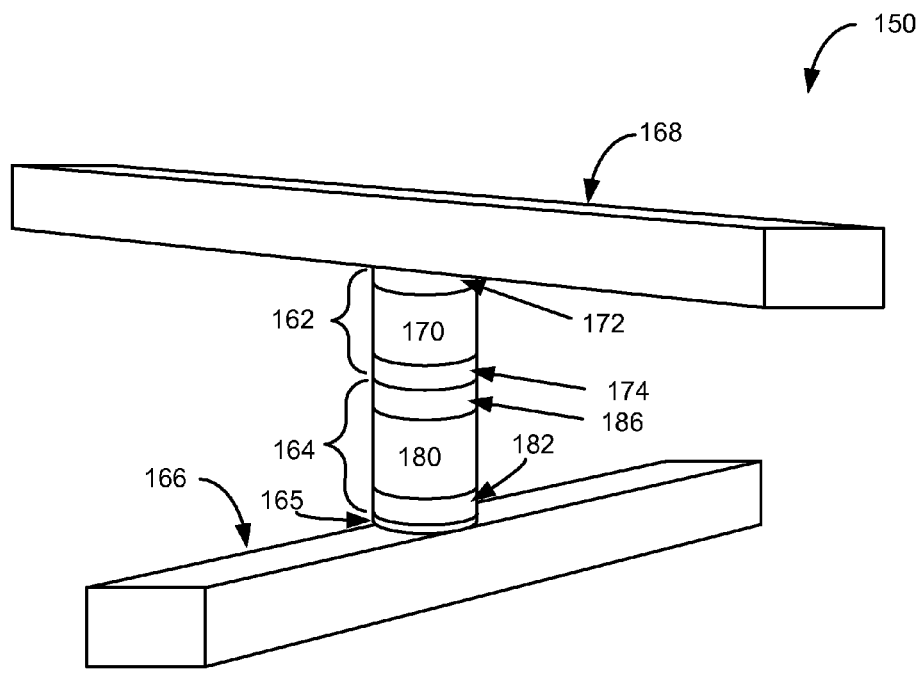
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 162 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an $NiO$-, $NiO_x$- or $NiO_xP_y$-containing layer may be selectively deposited above the steering element using a selective deposition process and then annealed and/or oxidized (if necessary). In other embodiments Hafnium oxide may be deposited by an atomic layer deposition process using a precursor containing Hafnium.

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_1$-$XCa_xMnO_3$ (PCMO), $La_1$-$XCa_xMnO_3$ (LCMO), $LaSrMnO_3$ (LSMO), or $GdBaCo_xO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass. Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in United States Patent Application Publication No. 2009/0323391, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
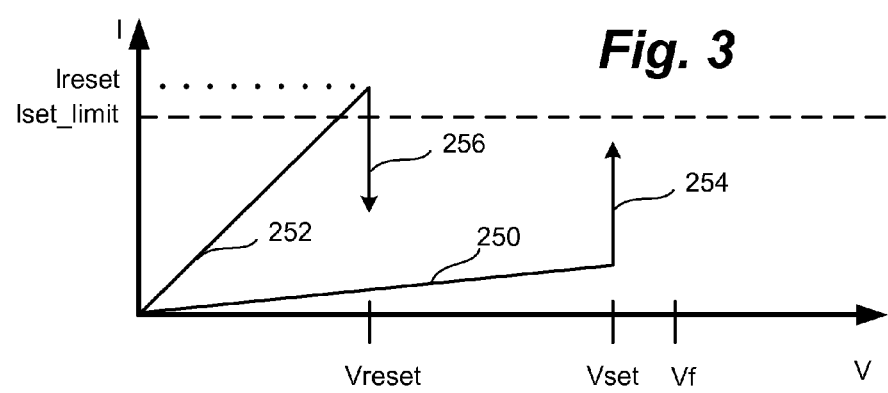
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in United States Patent Application 2009/0323391, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse (or other form). The Vset pulse will be shorter than the time needed to SET the reversible resistance-switching element so that the charge from the bit line and data bus will be needed to provide the extra charge not provided by the Vset pulse. For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then dissipate through the memory cell to the word lines, causing the memory cell to SET. One example of this capacitive discharge method can be found in United States Patent Application 2009/0323393, "Capacitive Discharge Method For Writing To Non-Volatile Memory," filed on Dec. 19, 2008, incorporated herein by reference in its entirety.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
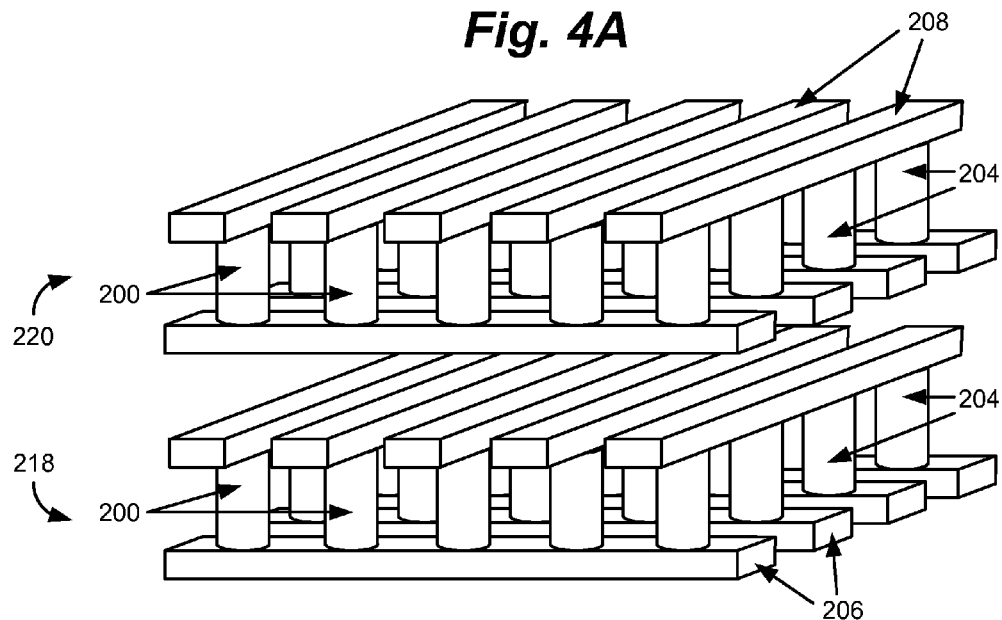
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
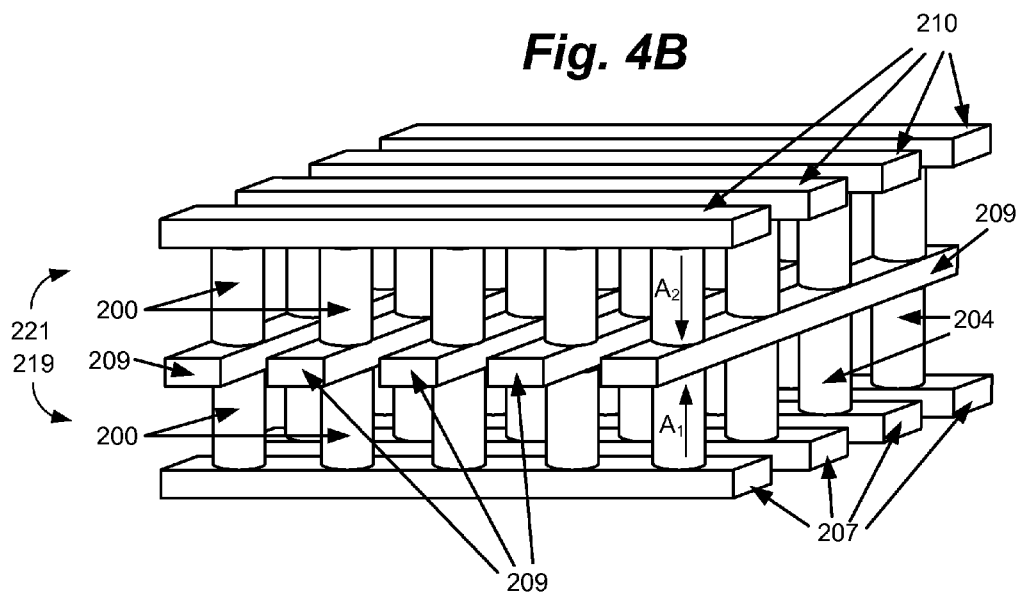
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952,030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow A₁ (e.g., with p regions at the bottom of the diodes), while the diodes of the second memory level 221 may be downward pointing diodes as indicated by arrow A₂ (e.g., with n regions at the bottom of the diodes), or vice versa.

Figure 5A:
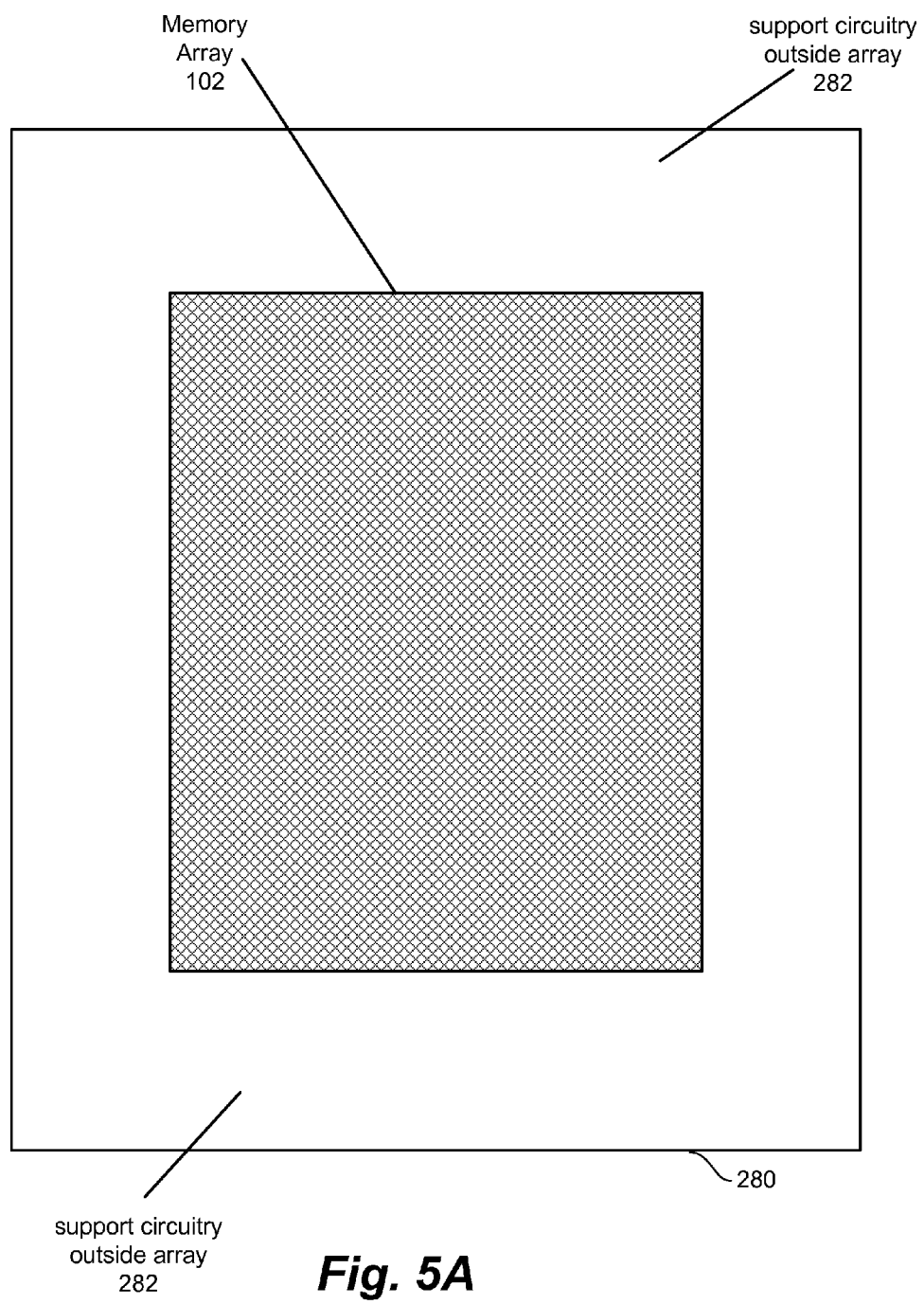
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
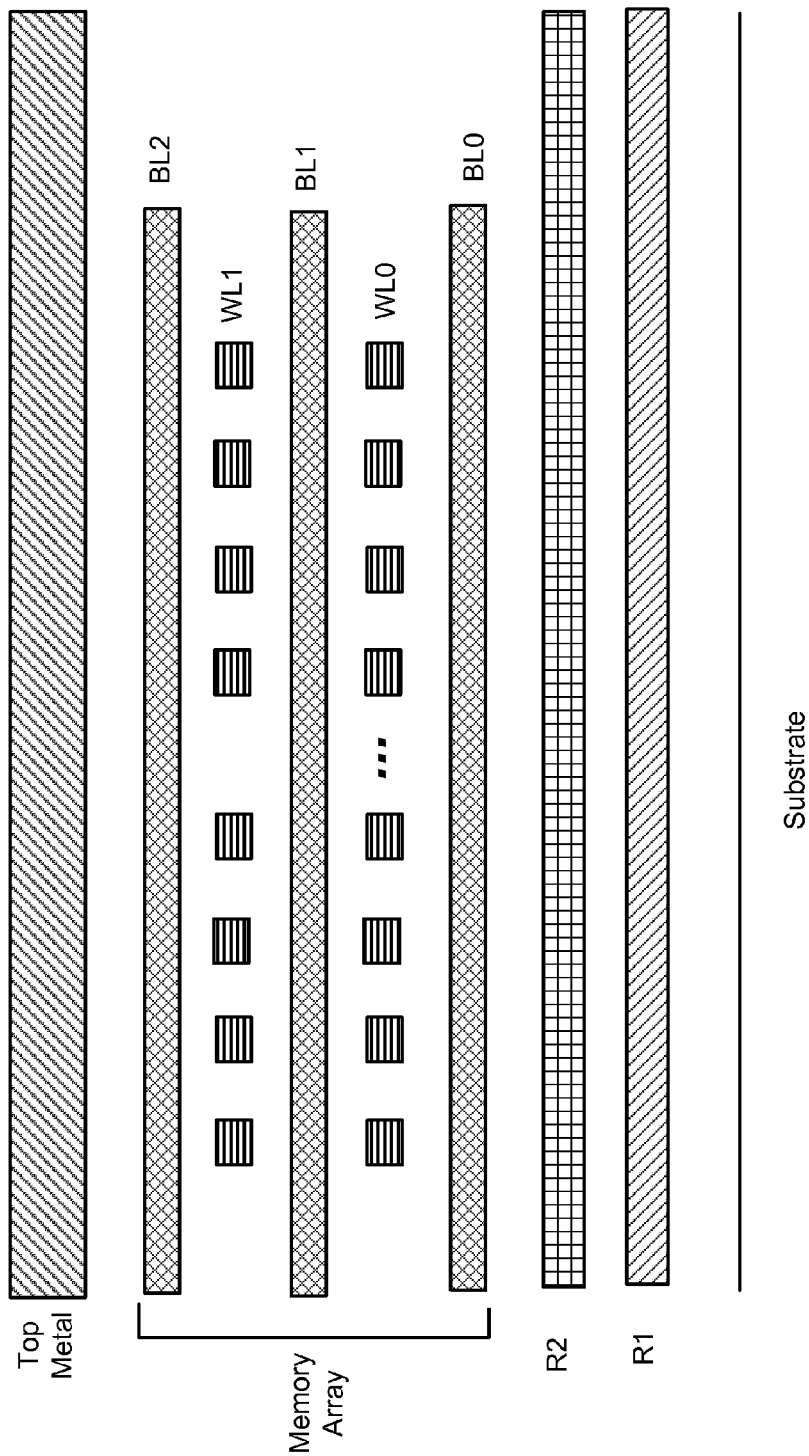
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
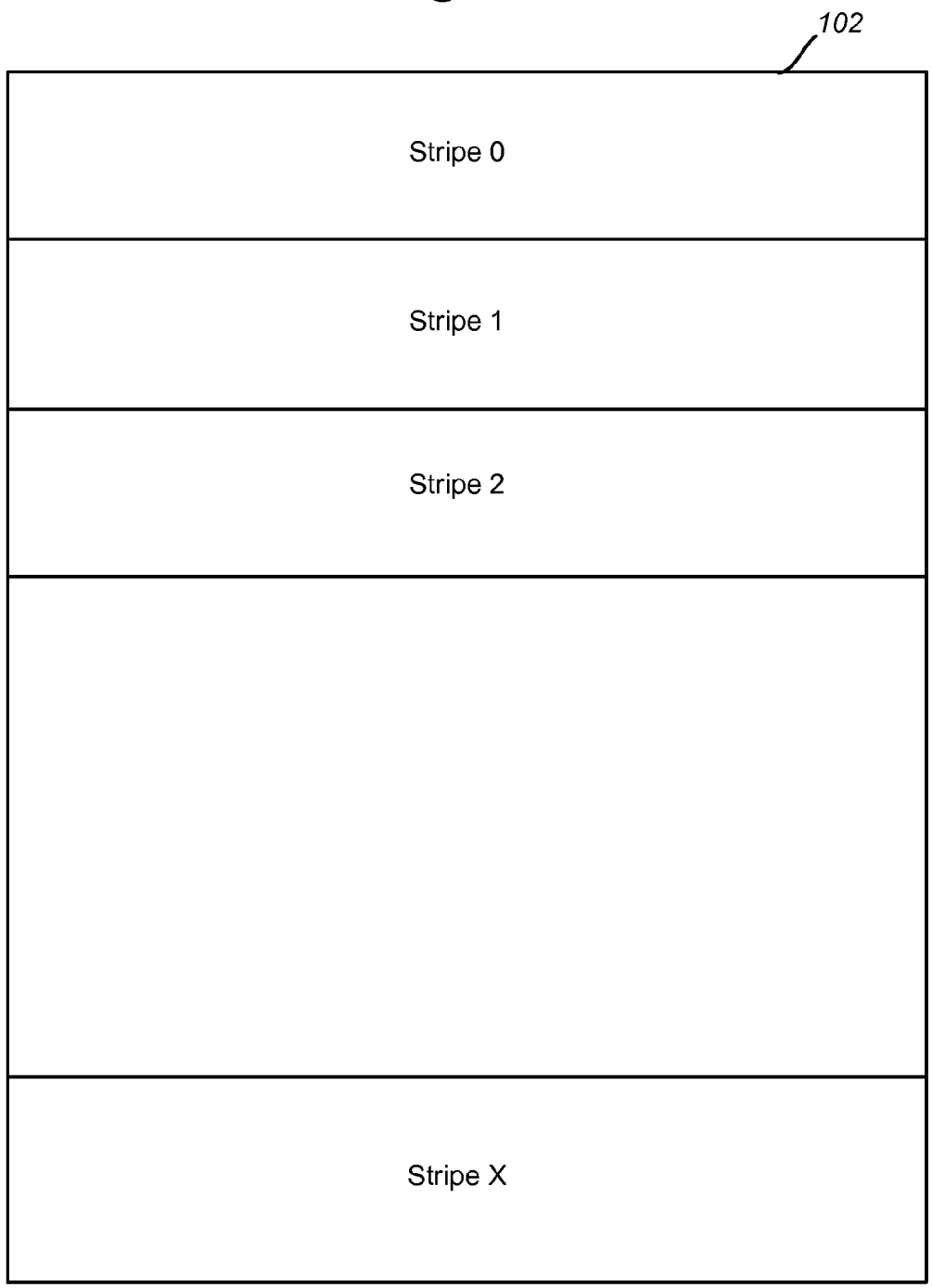
FIG. 6 depicts one example organization of a memory array.

Memory array 102 is subdivided into stripes, as depicted in FIG. 6. Each stripe is divided into blocks and blocks are grouped into bays. In one embodiment, each block includes two stripes. In other embodiments, one bay can be implemented in one strip or a portion of one stripe. In some implementations, a bay can be implemented across all or portions of two or more stripes. Each bay includes multiple blocks. The number of blocks in a bay can vary.

Figure 7:
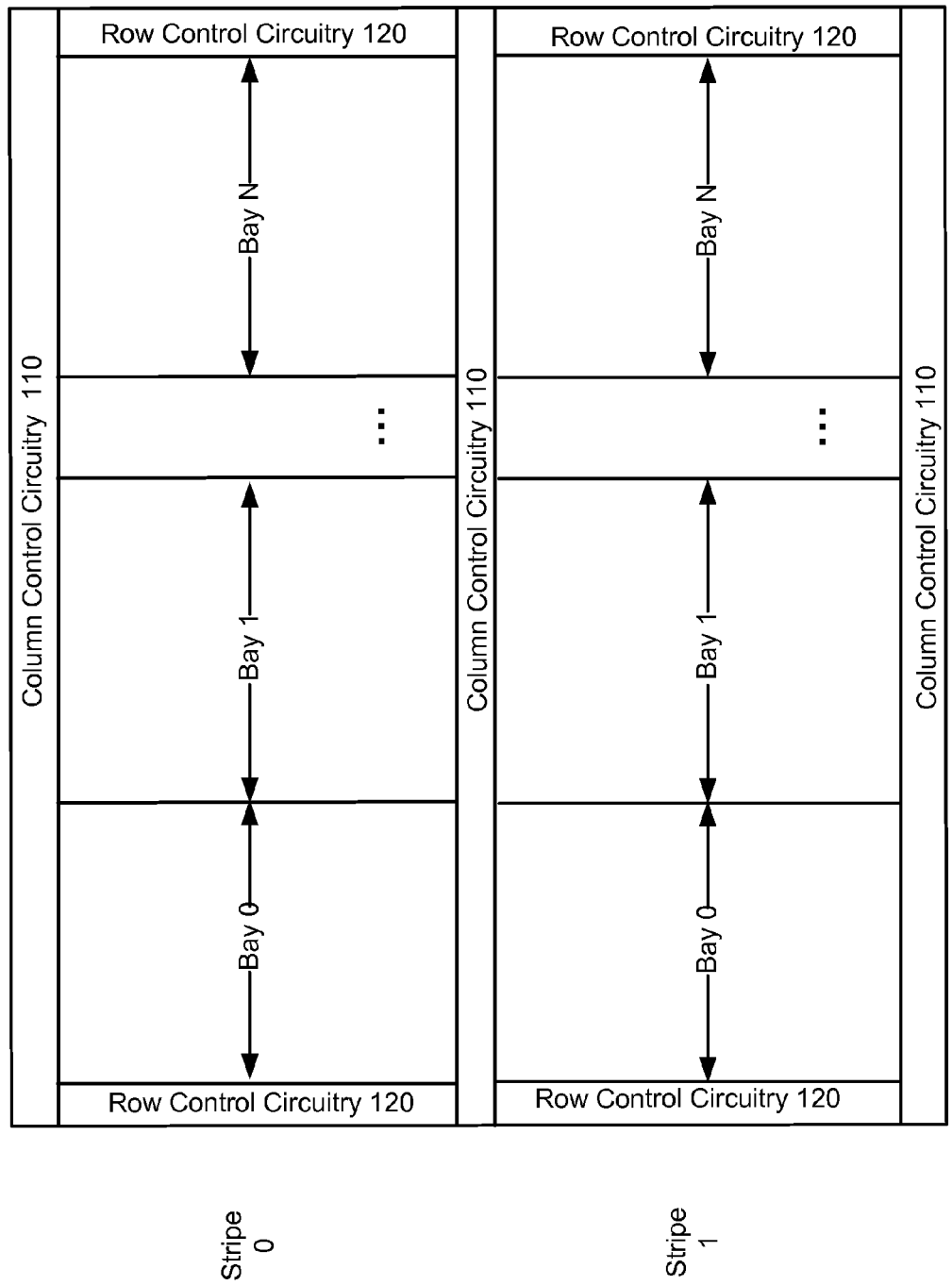
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
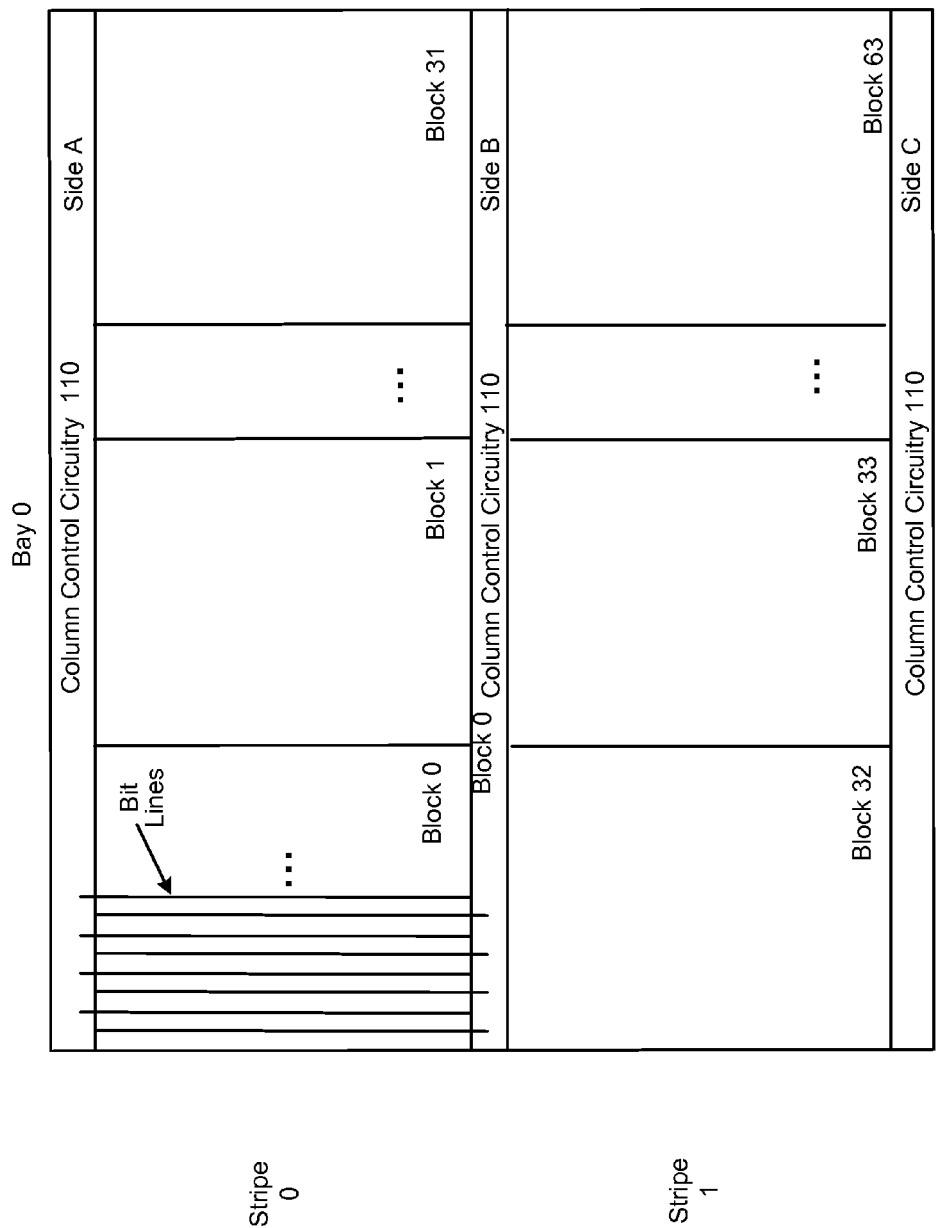
FIG. 8 depicts one embodiment of a bay.

FIG. 8 provides more details of one example bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and driver bit lines for its upper or bottom blocks.

In one set of embodiments, word lines (not depicted in FIG. 8) will be shared by two adjacent blocks. For example, half of the word lines connected to Block 1 will also be connected to Block 0 and the other half of the word lines connected to Block 1 will also be connected to Block 2. In one example implementation, every other word line connected to Block 1 will also be connected to Block 0, with the intervening word lines being also connected to Block 2. For embodiments word lines shared by two adjacent blocks, the word line drivers will be positioned on the substrate and between the two adjacent blocks. For example, a word line connected to Block 0 and Block 1 will be driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

In previous systems, global routing lines for routing signals between the 64 (or less) selected memory cells and the sense amplifiers were implemented in metals layers R1 or R2, which have a relatively large resistance and capacitance. To reduce overall resistance and capacitance, some previous designs have implemented half of the global routing lines for routing signals between the selected memory cells and the sense amplifiers in R1 (or R2) and the other half of the global routing lines for routing signals between the selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

To further reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 9:
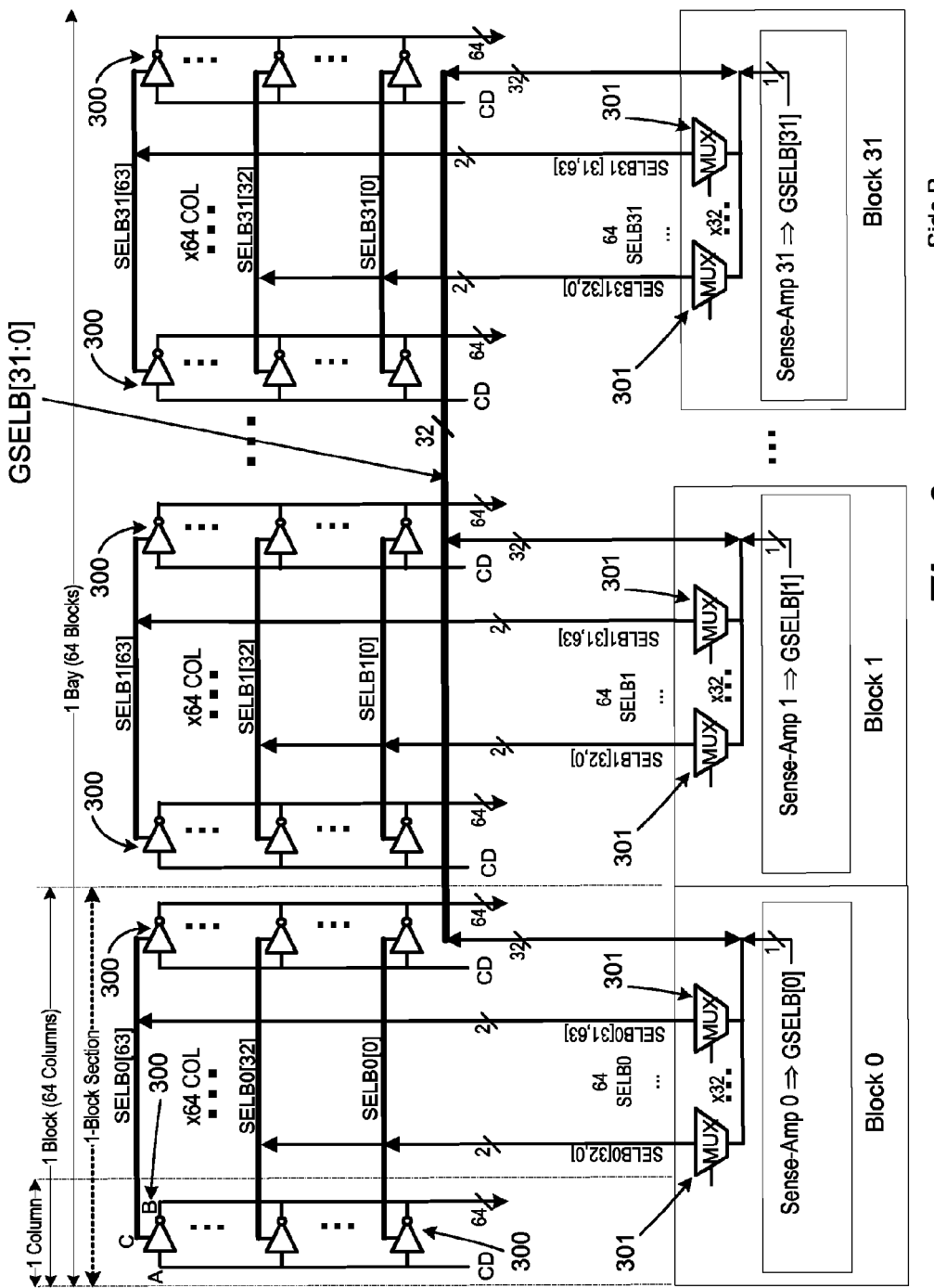
FIG. 9 is a schematic diagram of one embodiment of the data lines and selection circuits for connecting bit lines to the column control circuitry via the data lines.

FIG. 9 is a schematic diagram that depicts a portion of the routing signals and selection circuits for one embodiment of Column Control Circuitry 110. Depicted are portions of three blocks: Block 0, Block 1 and block 31. For each block, the bit lines are grouped into columns. Each block has 64 columns of selection circuits 300 for electrically connecting bit lines of the column to sense amplifiers on one side of the array (e.g. side A FIG. 8) and 64 columns of selection circuits for connecting bit lines to sense amplifiers on the other side of the array (e.g. side B of FIG. 8). FIG. 9 only shows the 64 columns of selection circuits 300 for connecting to side B. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has its own set of local data lines. For example, block 0 includes SELB0[63:0], block 1 includes SELB1[63:0], . . . block 31 includes SELB31 [63:0]. In one embodiment, the local data lines SELB0[63:0], SELB1[63:0], SELB31[63:0] are implemented in metal layer R1 under their respective block, and only run the width of the respective block. Selection circuits 300 for a particular column are used to selectively connect the 64 bit lines for that same column to 64 respective local data lines (SELB0[63:0], SELB1[63:0], . . . or SELB31[63:0]). As can be seen from FIG. 9, each of the selection circuits 300 receives a selection signal CD from column decoders 112 and a bit line connection from one of the 64 bit lines associated with the column. In one embodiment, each column will have its own selection signal CD. Based on the selection input from column decoder 112, the selection circuit 300 will connect or disconnect the bit line to a respective one of the local data lines (e.g., SELB0 [63:0], SELB1[63:0], SELB31[63:0]).

Looking back at FIG. 8, column decoders 112 choose one column and send to that chosen column a selection indication on the appropriate selection signal line CD so that the chosen column connects the respective 64 bit lines to the local data lines (SELB0[63:0], SELB1[63:0], . . . or SELB31[63:0]). Each block has its own set of thirty two 2:1 multiplexers (e.g., MUX 301) that are associated with the block and located on the substrate below the block. Each set of sixty four local data lines (SELB0[63:0], SELB1[63:0], . . . or SELB31[63:0]) are connected to a respective set of thirty two 2:1 multiplexers (MUX) for that respective block. For example, in block 0 the first multiplexer receives SELB0[0] and SELB0[32], the second multiplexer receives SELB0[1] and SELB0[33], . . . the thirty second multiplexer receives SELB0[31] and SELB0 [63]. Each of the multiplexers in a block receives a common selection signal and an enable signal from column decoders 112 so that thirty two of the sixty four local data lines are selected. In one embodiment, the multiplexers include the ability to bias the unselected SELB with the unselected bit line voltage VUB.

The thirty two selected local data lines are connected to global data lines GSELB[31:0] so that a memory operation (e.g. Read, SET, RESET) is performed on the selected memory cells. For example, SELB0[0] is selectively connected to GSELB[0], SELB0[1] is selectively connected to GSELB[1], etc. or SELB0[32] is selectively connected to GSELB[0], SELB0[33] is selectively connected to GSELB [1], etc. The global data lines GSELB[31:0] are implemented in Top Metal and connections between global data lines GSELB[31:0] and multiplexers (MUX) are made using zias (or vias). The global data lines GSELB[31:0] run across the entire Bay, with each Bay having its own set of global data lines. To reduce coupling between global data lines, various forms of Top Metal isolation can be used.

Each of the global data lines GSELB[31:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB [1], . . . and the output Sense-Amp31 of the sense amplifier located underneath block 31 is connected to GSELB[31]. Thus, the output of a particular sense amplifier is connected to a global data line, then to a local data line by way of a multiplexer, and then to a bit line by way of a selection circuit 300. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-to-well parasitic cap) is reduced by having a sectional data-line, by reducing number of bit line drives for each data-line (SELB).

As mentioned above, FIG. 9 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 9. Therefore, a selected block is associated with 128 selected bit lines that are connected to 128 local data lines, for which 64 multiplexers choose 64 local data lines to connect to 64 global data lines. The 64 global data lines are connected to 64 sense amplifiers associated with that particular bay. Therefore, at any given time 64 memory cells in a block can be simultaneously programmed. In some embodiments, less than 64 memory cells in a block will be simultaneously programmed to reduce power. The choice of 64 blocks in a bay, 128 bit lines in a column, using 128 local data lines, and 64 global data lines is for one set of embodiments. In other embodiments, different numbers of each item can be used.

Figure 10:
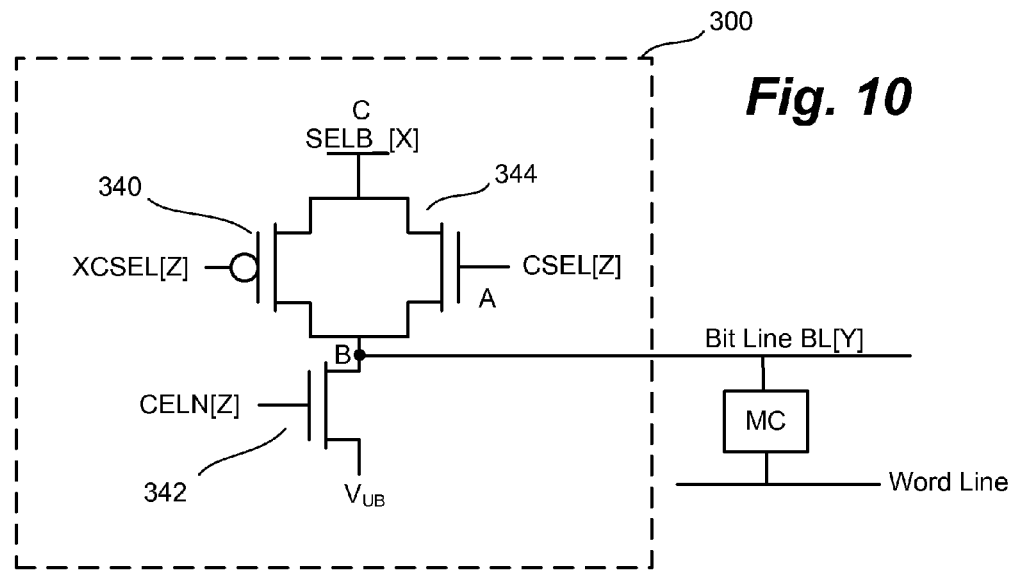
FIG. 10 is a schematic diagram of one embodiment of a selection circuit.

FIG. 10 is a schematic diagram showing the details of one embodiment of selection circuits 300. The selection circuit 300 is connected to one of the local data lines (labeled in FIG. 9 as SELB_[X]) and one of the bit lines. The bit line is connected to one terminal of the memory cell MC. A word line is connected to the other terminal of the memory cell MC. Selection circuit 300 includes p-channel transistor 340 and n-channel transistor 344 both connected to SELB_[X] at node C. Transistor 340 and transistor 344 are also both connected to n-channel transistor 342 at node B. The respective bit line BL[Y] is also connected to node B. Transistor 342 is also connected to VUB (e.g. 0.5 v), the unselected bit line voltage. The gate of transistor 340 is connected to selection signal XCSEL[Z]. The gate of transistor 344 is connected to selection signal CSEL[Z] at node A. Note that XCSEL[Z] is an inverted version of CSEL[Z]. The gate of transistor 342 is connected to CELN[Z]. The signals CSEL[Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z]. CSEL[Z] of FIG. 10 is analogous to CD of FIG. 9.

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL[Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB via the n-channel transistor 342. When transistors 340 and 344 are off and CELN[Z] is 0, then transistor 342 is off and the bit line BL[Y] is floating. This condition is useful for the some embodiments of the capacitance discharge method of programming described herein.

Figure 11:
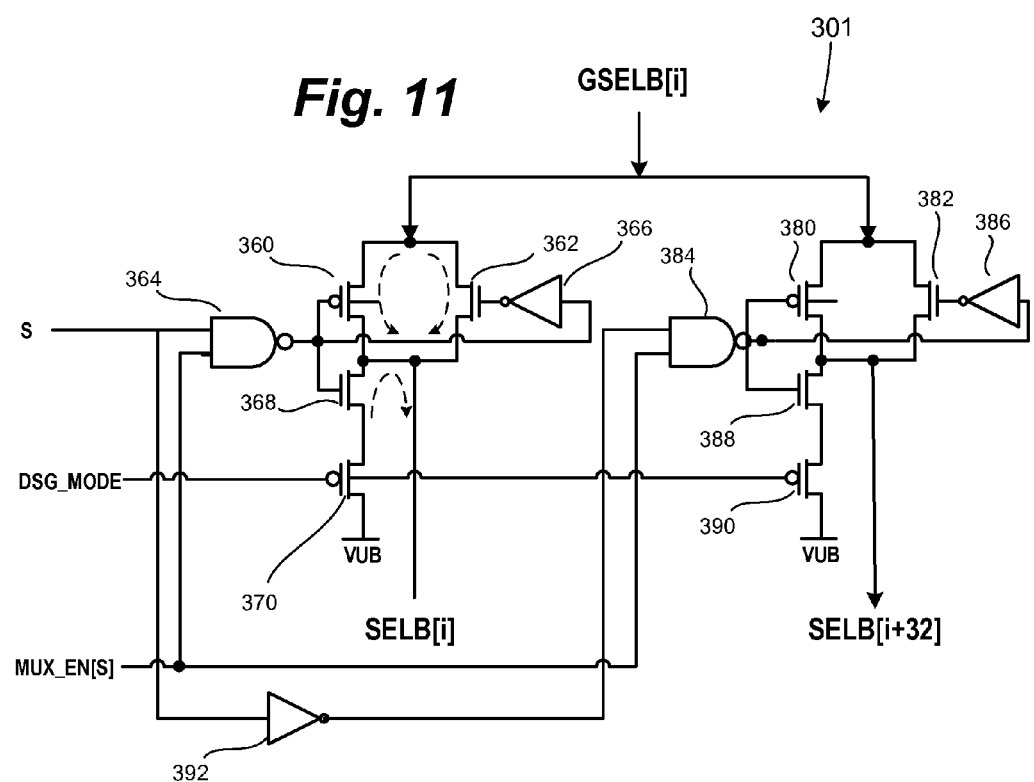
FIG. 11 is a schematic diagram of one embodiment of a multiplexer circuit.

FIG. 11 is a schematic of a circuit for the 2:1 multiplexer (MUX 301) depicted in FIG. 9. The respective global data line GSELB[i] is connected to transistors 360, 362, 380 and 382. Transistors 360 and 362 are also connected to the first of the two local data lines SELB[i]. Thus, transistors 360 and 362 provide a path between the global data line GSELB[i] and the local data line SELB[i] when the transistors are on. In addition to being connected to GSELB[i], transistors 380 and 382 are also connected to the second local data line SELB[i+32]. Thus, transistors 380 and 382 provide a path between global data line GSELB[i] and the second local data line SELB[i+32] when the transistors are on.

The gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 1 when performing one of the possible embodiments of the programming operation using the capacitance discharge mode of programming described herein. By setting signal DSG_MODE to 1, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 390 receives the signal DSG_MODE from system control logic 130. When DSG_MODE is set to 0 and SELB[i] is selected, SELB[i+32] receives VUB via p-channel transistor 390 (in some embodiments). When DSG_MODE is set to 0 SELB[i+32] is selected, SELB[i] receives VUB via p-channel transistor 370 (in some embodiments). The signal DSG_MODE is designed for use with the capacitive discharge method described above. When DSG_MODE is set to 1, SELB[i] can be charged up according to the data pattern. The signal MUX_EN[S] is disabled, and the signals SELB[i] and BL[i] are floating. The selected word line goes low and selected memory cells are programmed.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all 32 global data lines will be used for simultaneous programming. In one embodiment, two different MUX_EN[S] signals each connected to half the multiplexors are used to selectably connect half the GSELB bus to half of the local SELB[i] bus. In this case sixteen bit lines can be selected for simultaneous programming.

The circuits of FIGS. 8-11 can be used to implement the capacitive discharge method of programming discussed above. The circuit of FIG. 10 will be used to connect a column of bit lines to the local data lines SELB[63:0] and the circuit of FIG. 11 is used to connect half of the local data lines SELB[63:0] to the global data lines GSELB[32:0]. Once both connections are made, the thirty two sense amplifiers for side B are in communication with thirty two memory cells via the global data lines, the local data line and the bit lines for each side. During a SET operation, the sense amplifiers will apply a voltage to the global data lines to charge up the global data lines due to the parasitic capacitance of the global data lines. When the multiplexers of FIG. 11 (which are one embodiment of a selection circuit) connect the local data lines to the global data lines, then the local data lines will also be charged up. When the selection circuits of FIG. 10 (which are one embodiment of a selection circuit) connect the local data lines to a set of bit lines, the selected bit lines will also be charged. Once the bit lines are charged, the signals XCSEL[Z] and CSEL [Z] are toggled, which cuts off the bit line and leaves the bit line floating so that over time the bit line will discharge through the memory cell causing the memory cell to SET, as described above. Once the signals XCSEL[Z] and CSEL [Z] are toggled, the word line selection (discussed below) can change so that programming for the next word line will commence.

It is possible for memory data that is stored in the memory array to match user data to be programmed to the memory array as part of a write request. For example, a sequential series of bits of the user data to be programmed may match memory data in the memory cells. This may occur during re-writes to program memory cells that were not successfully programmed during an earlier programming iteration of the write process. The memory system may read back a unit of data such as a page after programming and verify that the page matches the data to be programmed. If not all of the data matches (or less than a predetermined number of bits match), then the page will be reprogrammed. Memory data may match user data for other reasons. For example, in an image file, it is possible that portions of the image are white and that the appropriate data for the white is already stored as memory data in the corresponding memory cells. When reprogramming the page, it is possible that portions of the data can be skipped because the memory data matches the user data to be programmed.

Some prior systems have an ability to skip programming for a column of memory cells. In one example, while programming data into a first column of memory cells during a write operation, the system evaluates whether programming for a second column of memory cells can be skipped. If the system determines that the second column of memory cells cannot be skipped, the second column of memory cells is programmed when the first column completes. If the system determines that the second column of memory cells can be skipped, the system waits until the first column of memory cells is programmed, and then evaluates whether the third column of memory cells can be skipped. If the third column of memory cells cannot be skipped, then the third column of memory cells is programmed. This process will continue. Once it is determined that the system should skip a column of memory cells in this process, the system remains idle until the current column of memory cells has completed programming. Other systems enable the memory system to evaluate and decide to skip multiple columns of memory cells while programming a prior column of memory cells. These systems may also evaluate whether to skip one or more sense amp addresses for a later column while programming an earlier column. In either of these solutions, evaluations of whether to skip a column or sense amp address are done during the write operation. Evaluating during the write operation can lead to bandwidth concerns for write operations by imposing additional load on the write process. Furthermore, some write operations may be too fast to enable evaluation of whether memory cells can be skipped. These operations also take place during writing of at least one column so that the column write process during which the evaluation takes place cannot be skipped as it is not evaluated. These systems have also been limited to skipping columns and sense amp addresses, particularly during the write operation itself.

For many memory arrays, like that of FIG. 9, write operations are divided into cycles. Many chip architectures divide write processes into bay address (BAD) cycles so that less than all of the bays are written simultaneously. Each bay may be written separately or multiple bays may be grouped together into a bay group that is written during one bay address (BAD) cycle. A single bay address (BAD) may correspond to one bay address (BAD) cycle. For example, if the memory array is divided into sixteen bays and the bays are divided into eight bay groups with two bays in each bay group, there are eight bay addresses for programming the sixteen bays in eight BAD cycles. If each bay is programmed individually, there are sixteen BAD's for programming the sixteen bays in sixteen cycles.

BAD cycles may further be divided into column address (CAD) cycles. In many architectures, the number of sense amplifiers (sense amps) for the memory array is less than the number of bits written during a typical write operation. For example, consider an example where each bay has 64 blocks and each block includes one sense amplifier and 64 columns. The sense amplifiers in each bay can access each block within the bay. Additionally, the sense amplifiers in each bay can access each block within the same stripe. Nevertheless, the memory capacity of the available sense amplifiers for a write operation is less than the amount of data received for most program commands.

For example, typical requests to write data to the memory array include a unit or group of data often referred to as a page of data. While page sizes may vary by implementation, it is common for a page of data or the page size to be 2048 KB. Because the capacity of the available sense amps to program a page of data is less than 2048 KB, the program or write operation is divided into groups or cycles to sequentially program the page of data in chunks that are less than the total page size. For example, if the total number of sense amps on the chip is equal to the product of the number of sense amps per bay (64) multiplied by the number of bays (16), or 1024 in this example. If the page size for programming is 2048 KB and each sense amp is capable of storing one bit of data, a page of data received with a write request is programmed in 16 different cycles, with each cycle programming 1024 bits. These cycles, defined by the quotient of the page size and the total number of sense amps, are typically referred to as column address (CAD) cycles. Each BAD cycle will thus include multiple CAD cycles. A column address (CAD) can be used to refer to one column address (CAD) cycle, where the CAD cycle writes one or more columns in each block for the BAD cycle.

In addition to BAD cycles and CAD cycles, many memory systems further divide the write operation into sense amp address cycles for power consumption control and other reasons such as program disturb. For example, while every sense amp can be enabled at a given time during write operations, many chip architectures choose to enable less than all of the sense amps at a given time to minimize power consumption and undue voltage drops or currents on chip. For example, if a single sense amplifier is enabled at a time for each CAD cycle in the above example, there will be 64 sense amp address (SAD) cycles within each CAD cycle. If two sense amplifiers are enabled in each CAD cycle, the number of SAD cycles for each CAD cycle would be 32, etc. A sense amp address (SAD) can be used to refer to one sense amp address (SAD) cycle, where the SAD cycle writes the data from less than all of the sense amps for a CAD cycle.

In accordance with one embodiment, a memory system and method are provided that enable an evaluation of whether to skip programming of portions of group of memory cells during a read before write operation. By evaluating skip information during a read before write operation, rather than during the write operation itself for example, the write operation can be expedited. The additional overhead for evaluating skip information is consumed during the read before write operation. Additionally, by performing a skip evaluation during the read before write operation, a full analysis of the availability of skipping programming for memory cells can be performed. Skip evaluations in different embodiments may be performed for entire BAD cycles, CAD cycles and/or SAD cycles. In some embodiments, some skip evaluations are performed during read before write operations while others are deferred to the write operation. In this manner, the number of data latches for storing skip information can be decreased.

Figure 12:
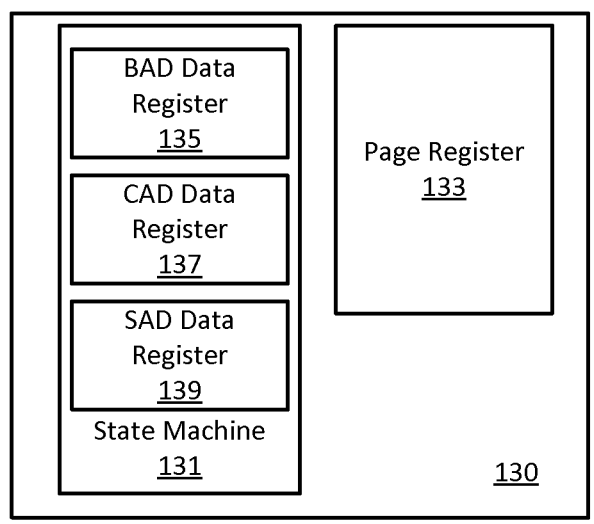
FIG. 12 is a block diagram of system control logic in one embodiment.

FIG. 12 is a block diagram of system control logic in accordance with one embodiment. System control logic 130 includes state machine 131, page register 133, BAD data register 135, CAD data register 137 and SAD data register 139. In one embodiment, a logical page of data is the minimum unit of data used for programming. Thus, memory is programmed and read in sets of pages. Page register 133 includes a register that can store a logical page of data for reading and writing. A page is typically implemented across multiple blocks as earlier described. In one embodiment, a page includes 2048 bytes of data and 128 bytes of header information (e.g., including ECC) for a total of 2176 bytes. Page register 133 will also include logic circuits to manipulate the data before writing (e.g., data encoding) and for verifying whether data read after a write process matches the data intended to be written (e.g., verify operation). The page register serves as an intermediate storage device with respect to the host and the memory array.

State machine 131 can include circuitry for providing various voltages, and other control circuitry. State machine 131 is used to control the reading and writing of data. FIG. 12 shows state machine 131 in communication with page register 133. In one embodiment, page register 133 includes control logic which can include a circuit(s) (digital and/or analog circuits) used to control page register. Data received by page register 133 can be processed to perform various data encoding, add ECC (error correction codes), or other functions. The data can be transferred to the support circuitry for the appropriate memory stripe for programming into memory array 102. Data read from memory array 102 is provided from the appropriate support circuitry for the appropriate memory stripe to the page register. The page register control logic can perform various decoding, ECC and verification processes. The final data is transferred to system control logic 130, controller 134 and/or the host.

BAD data register 135 stores bay address cycle skip information such as BAD bitmap data, CAD data register 137 stores column address cycle skip information such as CAD bitmap data and SAD data register 139 stores sense amplifier address cycle skip information such as SAD bitmap data. As noted, various embodiments may not include bitmap data for each cycle type. For example, CAD skip information may be derived from SAD bitmap data or skip information may not be used for each cycle type. Each data register can include a number of data latches as described hereinafter.

Figure 13:
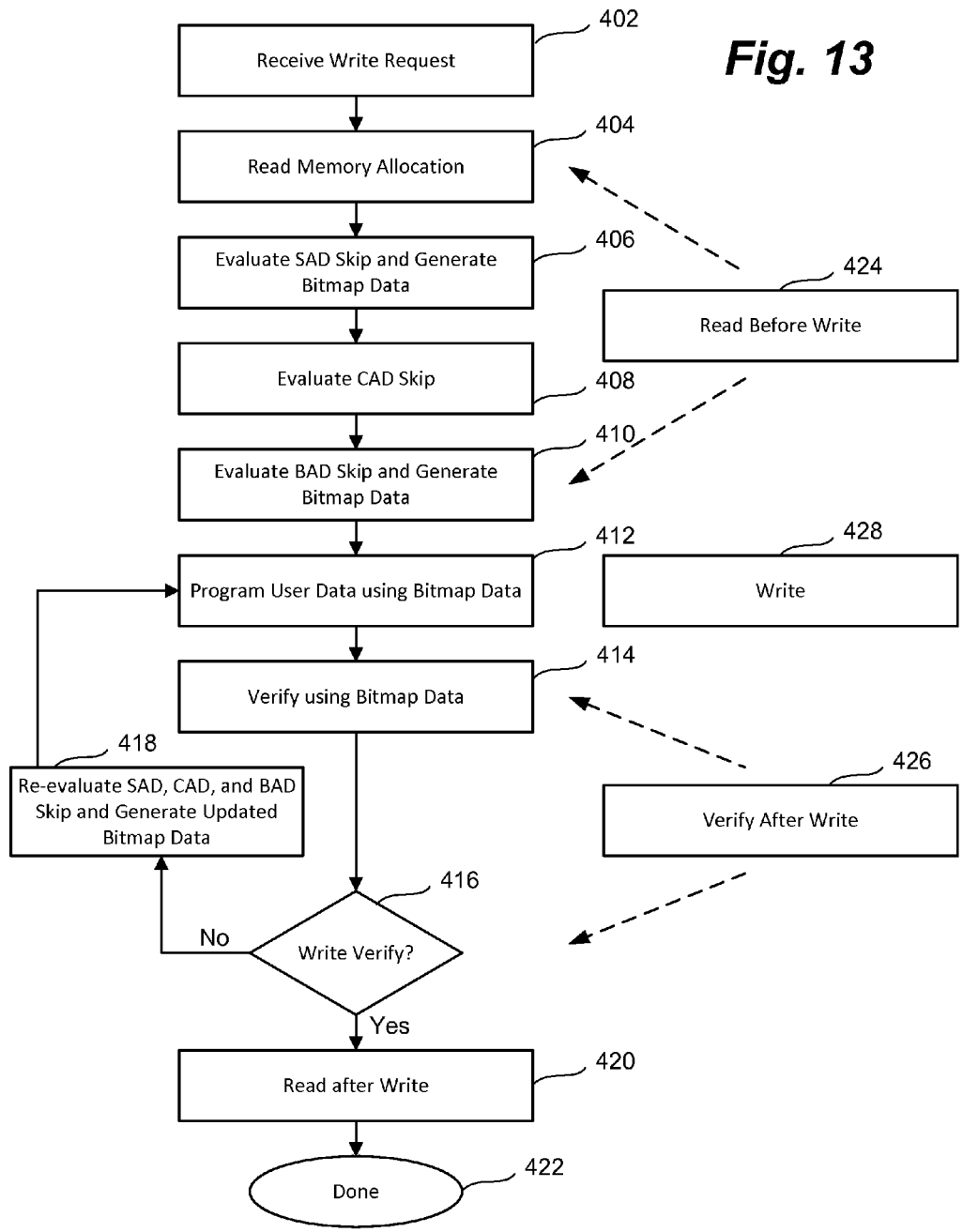
FIG. 13 is a flowchart describing a process for programming non-volatile storage in one embodiment.

FIG. 13 is a flowchart in accordance with one embodiment of programming memory cells of a memory array using skip information. At step 402, a request to write data to the memory system is received. In one example, the request includes or is provided with the data to be written. A page of data is received at step 402 in one embodiment although other units of programming or writing can be received. The request and data are received at a state machine 131 in one embodiment. In another example, the request and data are received at controller 132.

At step 404, the memory system initiates a read before write operation 424 prior to beginning the write operation itself. The system determines the memory allocation in the memory array for satisfying the write request and reads the existing memory data from the allocated memory. As the data is read in step 404, the system dynamically performs a skip evaluation for the write request in steps 406-410. At step 406, the system evaluates sense amp address (SAD) cycle skipping for the write request. At step 408, the system evaluates column address CAD cycle skipping for the write request. At step 410, the state machine evaluates bay address (BAD) cycle skipping for the write request. Although steps 404-410 are shown sequentially and in a particular order, they may be performed in various orders and non-sequentially. For example, steps 404-410 can be performed simultaneously to evaluate the skip information and generate the SAD, BAD and CAD bitmap data as the data is read in step 404.

In the particularly shown example, the skip evaluation at step 406 includes generating bitmap data for SAD cycle skipping. At step 406, the state machine can compare each memory data bit read from the memory array with the corresponding user data bit received at step 402. If the two bits match, the state machine generates and stores SAD skip information indicating that the SAD cycle can be skipped. If the two bits do not match, the state machine generates and stores SAD skip information indicating that the SAD cycle should not be skipped. In one example, the skip information is a bitmap for each SAD (corresponding to a SAD cycle). The bitmap can include a logical '1' stored in a data latch for the corresponding SAD. If the two bits do not match, the bitmap can include a logical '0' that is stored in the data latch. Other indications of whether the SAD cycle can be skipped can be used.

At step 408 in this example, a bitmap is not directly created and stored for CAD cycle skipping. Instead, the data latches for each SAD cycle within a CAD cycle can be grouped and subjected to a logical NAND operation to determine the CAD skip information. If every SAD data latch for a column indicates that the SAD cycle can be skipped, the CAD skip evaluation indicates that the CAD cycle can be skipped. If every SAD data latch does not indicate that the SAD cycle can be skipped, the CAD skip evaluation indicates that the CAD cycle cannot be skipped.

At step 410, the state machine generates bitmap data for BAD cycle skipping. In one embodiment, the state machine accesses the CAD skip evaluation (e.g., the result of a logical NAND for the SAD cycles). If the user data for every CAD cycle matches the user data, a data latch for the BAD can store an indication that the BAD cycle can be skipped. If the user data does not match, the data latch for the BAD can store an indication that the BAD cycle should not be skipped.

After evaluating skip information and generating bitmap data, the state machine executes the write operation 428. The user data is programmed to the memory array at step 412. Step 412 may include set or reset operations as earlier described. At step 412, the memory system cycles through the bay addresses, column addresses and sense amp addresses using the skip information. Step 412 includes writing the user data to the memory array using the bitmap data generated at steps 406-410. Each BAD cycle indicated to be skippable by the bitmap data is skipped. If a BAD cycle cannot be skipped, any CAD cycle within the BAD cycle indicated to be skippable by the bitmap data is skipped. If a CAD cycle cannot be skipped, any SAD within the CAD cycle indicated to be skippable by the bitmap data is skipped.

At step 414, the verify after write operation 426 begins by verifying whether the data programmed at step 412 matches the user data received at step 402. In FIG. 13, only the data written at step 412 is verified. The state machine can use the bitmap data to determine which data to verify. Recognizing that the data determined to be skippable does not need to be verified, the verify operation is accelerated to examine only those memory cells that were actually programmed at step 412. Thus, the state machine skips the verify operation for any BAD cycles, CAD cycles or SAD cycles indicated to be skippable by the bitmap data.

At step 416, the state machine determines whether the write operation was successful based on the verification at step 414. Step 416 can include determining whether all, or a predetermined number of the targeted bits were successfully programmed. If the write operation is verified at step 416, a read after write operation is performed at step 420 to read back all of the data from the memory allocation targeted for the user data. At step 422, the request to write information is completed.

If the write operation is not verified at step 416, the state machine re-evaluates SAD, CAD and BAD cycle skipping and generates updated bitmap data for the SAD skip evaluation and BAD skip evaluation at step 418. In one embodiment step 418 is performed dynamically as the data is read and verified from the memory array at step 414. Step 418 enables the state machine to generate bitmap data that will enable additional cycle skipping as additional memory cells are successfully programmed with the user data. An additional set or reset write operation is performed at step 412 to write the unsuccessfully verified bits and the process continues.

Figure 14:
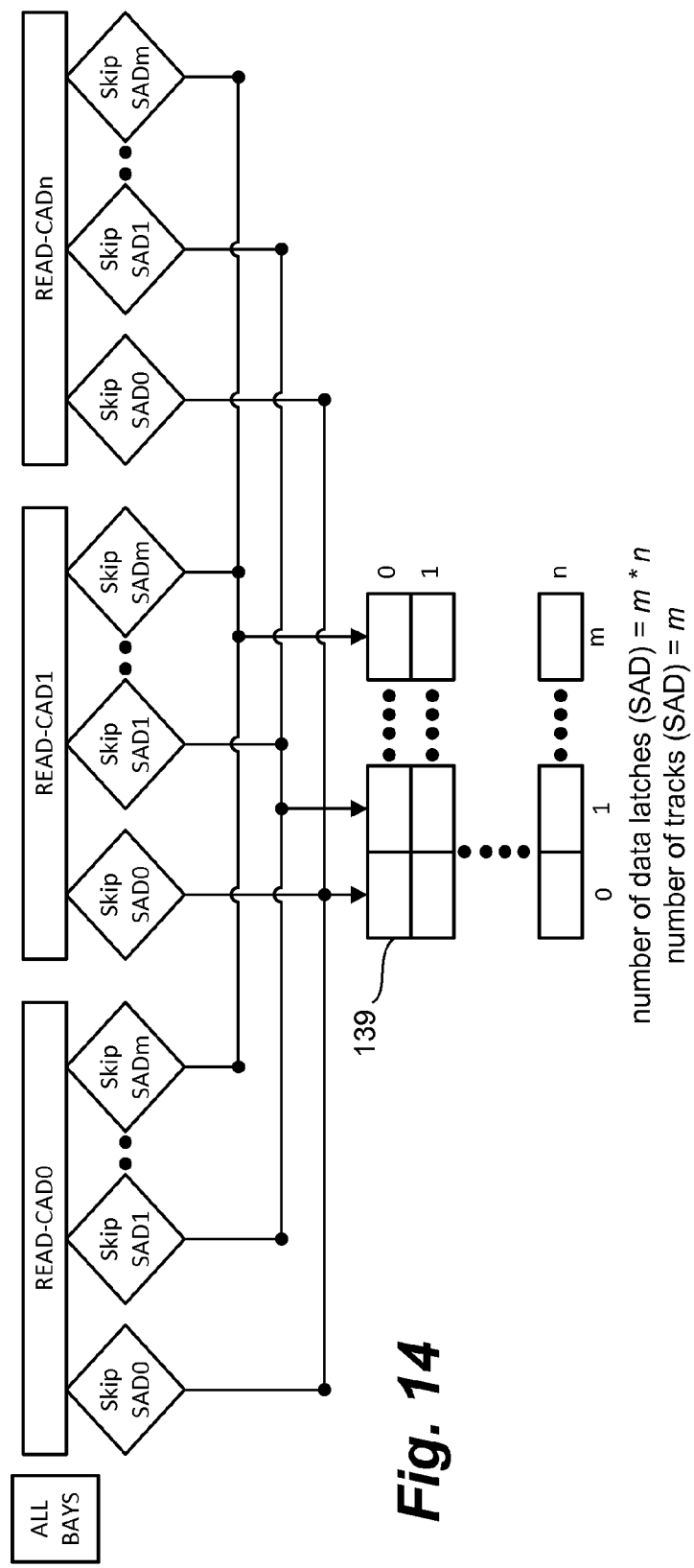
FIG. 14 is a block diagram depicting data latches and a process for generating bitmap data for bay address cycle skipping

FIG. 14 is a block diagram describing details of evaluating SAD and CAD cycle skipping and generating bitmap data as can be performed at steps 406 and 408 of FIG. 13. For all bays on the chip, the state machine reads the columns as shown at step 404 of FIG. 13. In FIG. 14, the columns within a bay or stripe are programmed in a number (n) of column address (CAD) cycles. Each CAD cycle is denoted by a column address CAD0, CAD1 . . . CADn in FIG. 14. The number n of CAD cycles in one embodiment is equal to the quotient of the size of the unit of programming (e.g., page size) and the total number of sense amplifiers of the memory system.

Within each CAD cycle, there are one or more SAD cycles. In this example, the sense amplifiers are grouped into m SAD cycles. Each SAD cycle is denoted by a sense amplifier address SAD0, SAD1 . . . SADm. The SAD or SAD cycle may correspond to one or multiple sense amplifiers for a CAD cycle. For example, in the example of FIG. 9, 64 SAD cycles can be defined by writing a single bit at a time during each CAD cycle or 32 SAD cycles can be defined by writing two bits at a time during each CAD cycle.

Within each CAD cycle, the state machine determines for each SAD cycle whether the memory data matches the user data. For example, the state machine determines whether the memory data for SAD cycle SAD0 of CAD cycle CAD0 matches the targeted user data. If the data matches, the state machine stores an indication in a data latch of register 139 that SAD cycle SAD0 can be skipped during the write operation. The determination and updating of the data latch is done dynamically as the memory data is read during the read before write operation 424. When the state machine receives the data for SAD cycle SAD1 of CAD cycle CAD0, it is compared to the user data and the corresponding data latch is updated. As shown in FIG. 14, the number of data latches for storing the bitmap data of the SAD skip evaluation is equal to the product of the number n of CAD cycles and the number m of SAD cycles. In addition to the data latches, a number of tracks or metal lines for communicating the data between the state machine and data latches can be provided. In one embodiment, the number of tracks is equal to the number m of SAD cycles as shown in FIG. 14. Each track can connect the state machine to a column of data latches for each CAD cycle.

Figure 15:
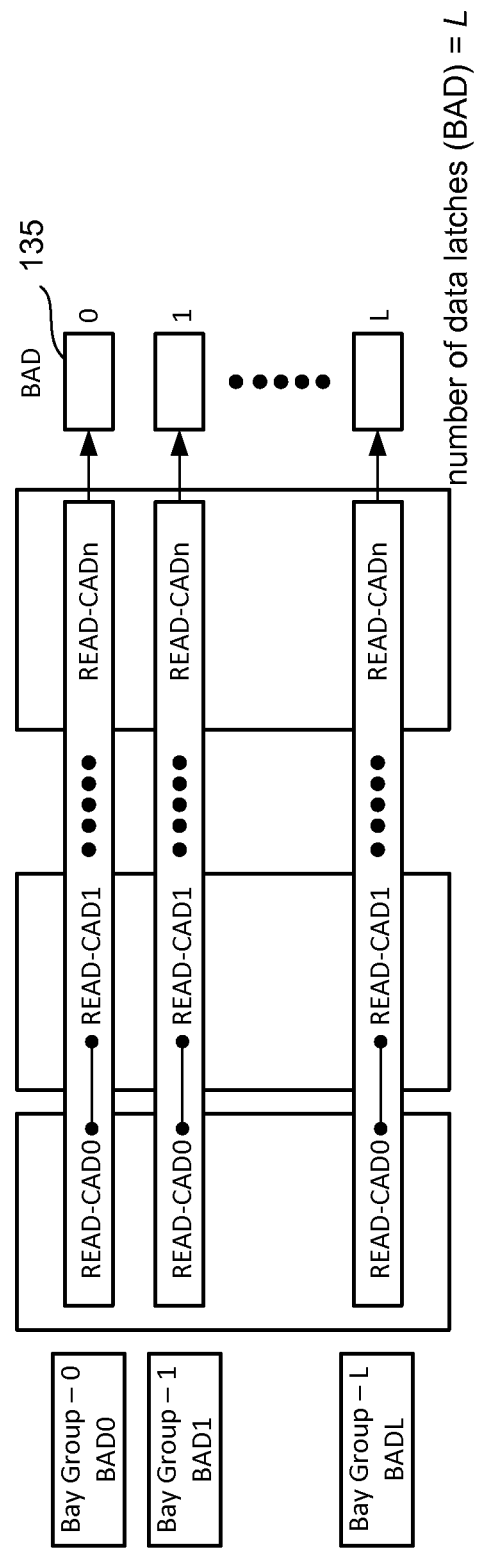
FIG. 15 is a block diagram depicting data latches and a process for generating bitmap data for column address cycle skipping and sense amplifier address cycle skipping.

FIG. 15 is a block diagram describing a process for evaluating BAD cycle skipping and generating bitmap data as can be performed at steps 410 and 418 of FIG. 13. In FIG. 15, the bays of the memory array are arranged into a number of groups. Each bay group can include one or more bays. The bay groups are programmed separately in a number L of bay address (BAD) cycles that is equal to the number of groups. For each BAD cycle, denoted by bay addresses BAD0-BADL, the state machine determines whether the BAD cycle can be skipped based on the evaluation of each CAD cycle within the BAD cycle. If every CAD cycle within a BAD cycle can be skipped, the BAD cycle can be skipped. The state machine stores an indication in a data latch of register 135 for each BAD cycle to indicate whether the cycle can be skipped based on whether each corresponding CAD cycle can be skipped. The number of data latches for storing the bitmap data for the BAD cycle skip information is equal to the number L of BAD cycles. Similarly, the number of tracks for connecting the data latches of register 135 to the state machine is equal to the number L of BAD cycles.

Figure 16:
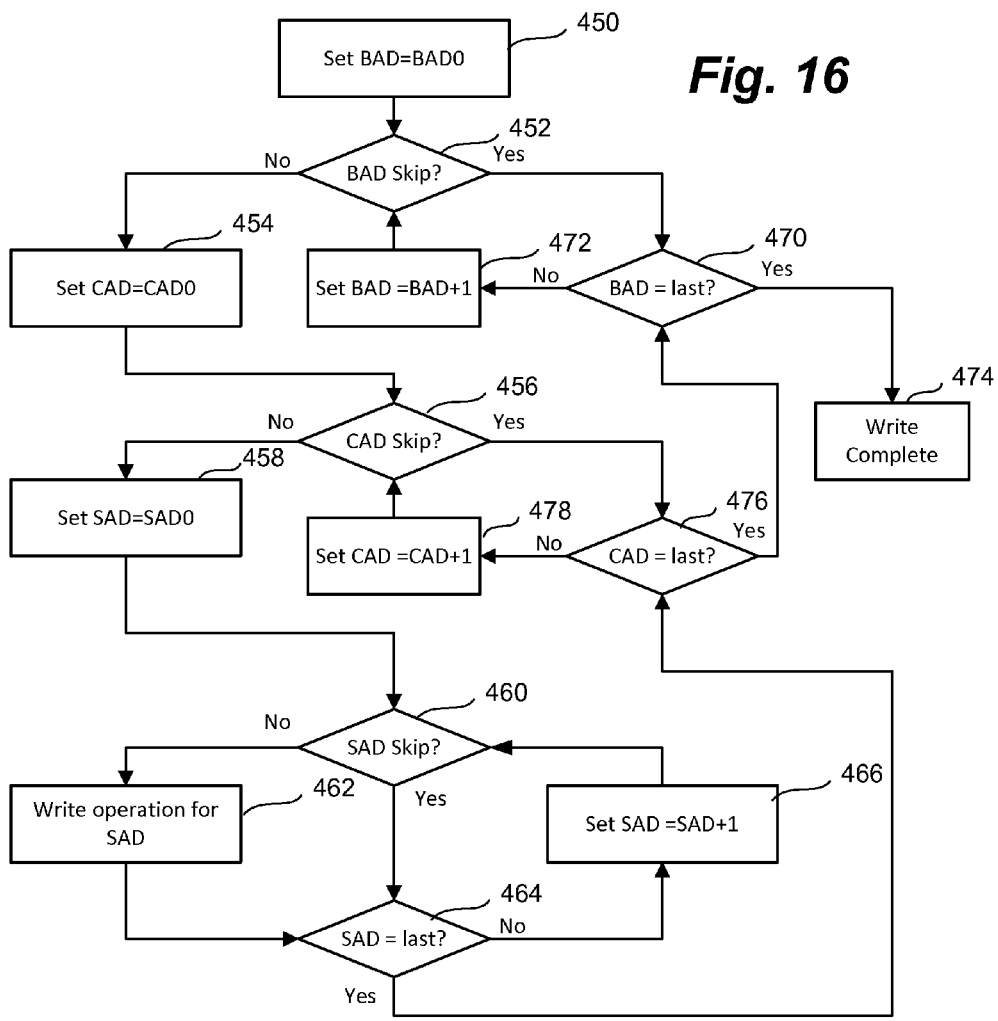
FIG. 16 is a flowchart describing a process for writing user data in accordance with one embodiment.

FIG. 16 is a flowchart describing a method of programming user data using skip information in accordance with one embodiment. FIG. 16 can be performed at step 412 of FIG. 13 in one embodiment. At step 450, the state machine sets the BAD cycle to BAD0. At step 452, the state machine accesses the data latch from register 135 for the bitmap data of BAD cycle BAD0. The state machine determines whether to program the BAD cycle based on the bitmap data. If the bitmap data indicates that cycle BAD0 should be skipped, the state machine does not program data for the BAD cycle. The state machine may skip programming for a BAD cycle by not transferring any data for the BAD cycle from the page register to the sense amps for the memory array in one embodiment.

After skipping programming for the BAD cycle, the state machine determines at step 470 whether the current BAD cycle is the last BAD cycle. If the current BAD cycle is not the last, the BAD cycle is incremented by one at step 472. At step 452, the state machine checks whether the new BAD cycle can be skipped.

If the skip information indicates that BAD cycle BAD0 should not be skipped, the state machine sets the CAD cycle to CAD0 at step 454. At step 456, the state machine accesses the data latch storing the bit map data for CAD cycle CAD0. If the bit map data indicates that CAD0 should be skipped, the state machine does not write data for the CAD cycle to the memory array. In one example of step 456 the state machine may skip transferring data from the page register to the memory array. The state machine may skip selection of columns within the CAD cycle for transfer on each of the data buses PR_OUT[15:]. At step 456, the state machine may skip the transfer of data from page register 133 to the sense amps for programming for the CAD cycle. Step 456 can include skipping the transfer of data for multiple columns to the sense amplifiers for programming.

At step 476, the state machine determines whether the current CAD cycle is the last for the current BAD cycle. If the CAD cycle is not the last, the state machine increments the CAD cycle by one at step 478 and returns to step 456 to determine whether the next CAD cycle can be skipped.

If the skip information indicates that CAD cycle CAD0 should not be skipped, the state machine sets the SAD cycle to SAD0 at step 458. At step 460, the state machine accesses the data latch with the bit map data for SAD cycle SAD0 to determine the skip information. If the skip information indicates that SAD cycle SAD0 should be skipped, the state machine skips programming for SAD cycle SAD0 at step 460. In one example, the data for one CAD cycle is transferred to the sense amplifiers for programming at a time. If an entire CAD cycle cannot be skipped, the state machine can transfer data for the CAD cycle to sense amps in one example. Accordingly, in one embodiment step 460 includes skipping the programming of data transferred to sense amps, for example through a sense amp enable signal. In another example, step 460 can include skipping the transfer of data from page register 133 to the sense amplifiers.

If the skip information indicates that SAD cycle SAD0 should not be skipped, the state machine performs the write operation for SAD0 at step 462. The state machine determines whether the SAD cycle is the last cycle for the current CAD cycle at step 464. If the SAD cycle is not the last for the CAD cycle, the state machine increments the SAD cycle by one at step 466. The state machine then determines whether the current SAD cycle can be skipped at step at step 460.

If the SAD cycle is the last, the state machine determines whether the current CAD cycle is the last at step 476. If the current CAD cycle is not the last, the CAD cycle is incremented at step 478 as described above. If the current CAD cycle is the last, the state machine determines whether the current BAD cycle is the last at step 470. If the current BAD cycle is not the last, the BAD cycle is incremented by one at step 472 as described above. If the BAD cycle is the last, the state machine completes the write operation at step 474.

Figure 17:
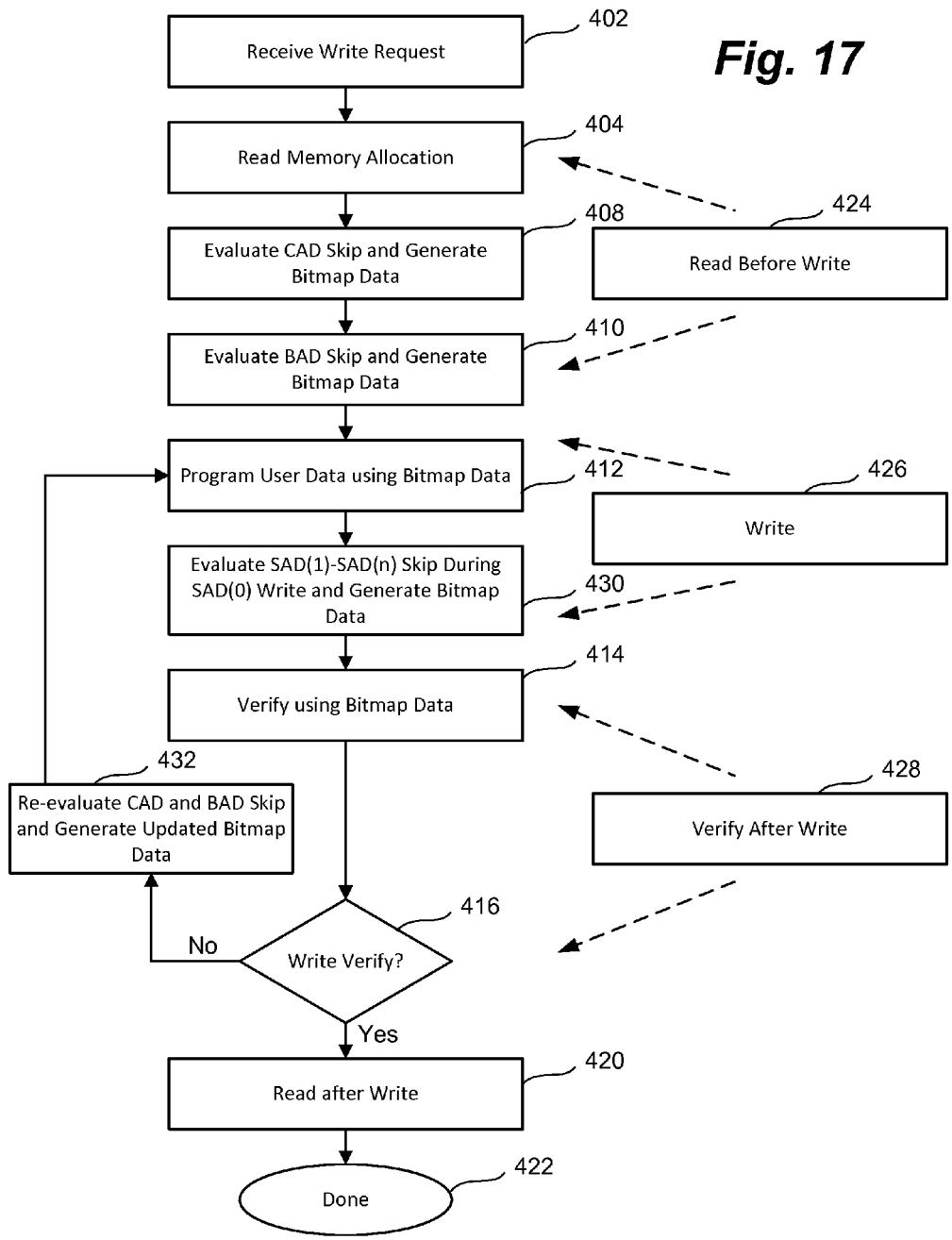
FIG. 17 is a flowchart describing a process for programming non-volatile storage in one embodiment.

FIG. 17 is a flowchart describing another embodiment of programming where the evaluation of skip information for a write operation is divided, with part of the evaluation being carried during a read before write operation 424 and another part being carried out during a write operation 426. Generally, fewer data latches may be used by shifting some of the evaluation to the write operation.

A write request is received at step 402. A read before write operation 424 is then performed. The memory allocation is read at step 404. In this example, while reading the memory allocation a CAD and BAD skip evaluation are performed, but no SAD skip evaluation is performed as described in FIG. 13. The state machine evaluates CAD cycle information for the columns and generates CAD cycle bit map data at step 408. The state machine determines whether the user data for each CAD cycle matches the memory data read from the corresponding memory cells. In this example, because the SAD bit map data is not generated during the read before write operation, the system uses data latches to store CAD bit map information. This can be contrasted with the embodiment in FIG. 15 where the CAD skip information is derived from the SAD skip information without using additional latches. At step 410, the state machine evaluates BAD skip information for each BAD cycle or bay group and generates bitmap data. Steps 404-410 can be performed simultaneously to evaluate the skip information and generate the BAD and CAD bitmap data as the data is read in step 404.

At step 412, write operation 426 begins by programming the user data using the bitmap data. The state machine skips the write operation for any BAD cycles indicated to be skippable in register 135. For BAD cycles that are not skipped, the state machine accesses the CAD skip information to determine whether any CAD cycles within the BAD cycle can be skipped. When programming during a CAD cycle at step 430, the state machine first writes to memory cells for the SAD0 cycle. While writing for the SAD0 cycle of the CAD cycle, the state machine evaluates skip information for SAD cycles SAD1-SADn of the current CAD cycle. The state machine compares the memory data read from the array in step 404 to the user data in the page register for SAD1-SADn in one example. If the data matches, the state machine determines that the SAD cycle can be skipped. The state machine writes the information into a data latch of register 139 corresponding to the SAD cycle. Because the SAD cycle skip evaluation is performed during the SAD0 cycle for each CAD cycle, the state machine only has to maintain the skip information during the particular CAD cycle. Accordingly, the number of data latches to store the SAD skip information is equal to one less than the to the number m of SAD cycles. The number of data latches for the SAD cycles is one less than m because skip information is not stored for SAD cycle SAD0. This can be contrasted with the technique in FIG. 15 where the number of data latches needed to store the SAD cycle skip information is equal to the product of the number of m SAD cycles and the number n of CAD cycles. Although shown as sequential operations, programming the user data at step 412 and evaluating the skip information at step 430 will be performed in parallel. The state machine programs the user data for SAD cycles SAD(1) to SAD(n) at step 412 using the bit map data generated while programming the user data for SAD cycle SAD0.

After programming the user data using the BAD, CAD and SAD cycle skip information, the user data is verified at step 414 as described for FIG. 13. The skip information is used at step 414 so that only user data actually written to the memory array is verified. At step 416, the state machine determines whether all or a predetermined amount of the user data was successfully written to the memory array. If the user data is not verified, the state machine re-evaluates skip information at step 432. The skip information is re-evaluated for the CAD cycles and BAD cycles. The state machine generates updated bit map data. As with steps 408 and 410, the state machine does not generate skip information for the SAD cycles at step 418. In on embodiment, step 432 is performed dynamically as the data is read and verified from the memory array at step 414. After re-evaluating the skip information, the state machine returns to step 412 to program the user data using the updated bit mappings.

If the user data is successfully verified at step 416, the state machine performs at read after write operation at step 420 for the memory data programmed in response to step 402. The write operation is completed at step 422.

Figure 18:
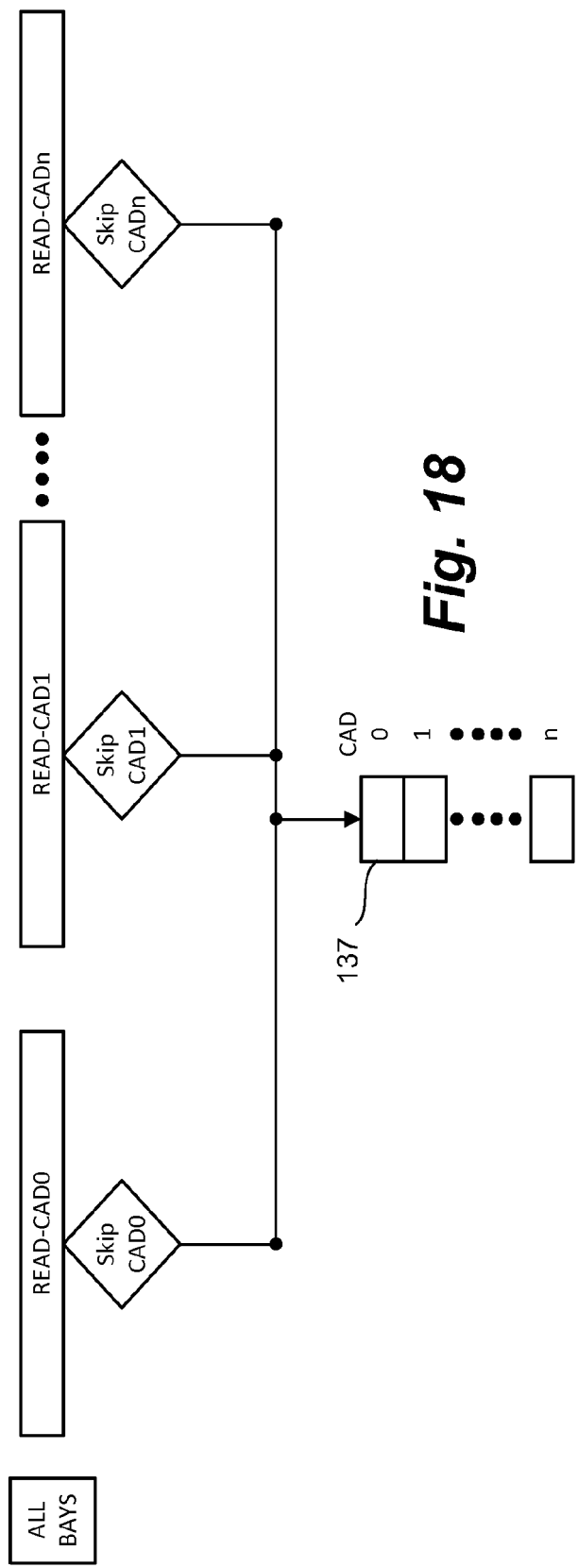
FIG. 18 is a block diagram depicting data latches and a process for generating bitmap data for column address cycle skipping in one embodiment.

FIG. 18 is a block diagram describing one embodiment of generating CAD cycle skip information in accordance with one embodiment. In one example, the process depicted in FIG. 18 can be used at step 408 of FIG. 17. In this embodiment, there is no SAD skip evaluation or bit map data generated during the read before write operation. Accordingly, the state machine accesses the memory data read from the memory allocation for the CAD cycle at step 404 and compares the memory data with the memory data received at step 402 with the write request. The process in FIG. 18 is performed for all bays. The state machine compares the memory data read for CAD cycle CAD0 with the user data to be programmed in CAD cycle CAD0. If the data matches, the state machine stores a value in a data latch of register 137 for CAD0 indicating that CAD0 can be skipped during the write operation. In one example, the state machine writes or maintains a logical '1' in a data latch to indicate that the CAD cycle can be skipped. If the data does not match, the state machine can store an indication in the data latch for CAD0 that CAD0 should be programmed during the write operation. In one example, the state machine stores a logical '0' in the data latch to indicate that the CAD cycle should not be skipped. In one example, the data latches may store a one by default such that the state machine does not write to the corresponding data latch when the data matches so that the '1' remains and writes to the corresponding data latch when the data does not match to replace the '1' with a '0.' After evaluating CAD0, the state machine evaluates CAD cycle CAD1 and updates or writes the appropriate indication into the data latch of register 137 for the CAD cycle CAD1. The state machine repeats the process until all CAD cycles have been evaluated.

As FIG. 18 illustrates the number of data latches for storing the bitmap data for n CAD cycles is equal to n. This can again be contrasted with the technique in FIG. 15 where the number of data latches is equal to the product of the number n of CAD cycles and the number m of SAD cycles to store bit map data for each SAD cycle during the read before write operation. The number of tracks for transferring the bitmap data from register 137 is one.

FIG. 18 shows the data latch configuration for a non-pipelined architecture. Other embodiments may be implemented in a pipelined architecture where two columns are written for each individual CAD. These columns are typically referred to as a top column and a bottom column. In a pipelined architecture for instance, the number of data latches needed to store the CAD skip information is equal to n*2 where n is the number of CAD cycles. The number of tracks for transferring the CAD skip information in a pipelined architecture from register 137 is two to accommodate the top and bottom columns. For more information regarding pipelined architectures, refer to U.S. Pat. No. 8,213,243, incorporated by reference herein in its entirety.

In the technique demonstrated in FIG. 17, the BAD skip information is evaluated the same as shown in FIG. 15. The state machine determines from the skip information for each CAD cycle of a BAD cycle whether the entire BAD cycle can be skipped. Thus, a number L of data latches equal to the number of BAD cycles is used to store skip information for the BAD cycles. The number of tracks to transfer the BAD cycle skip information is also equal to L.

Figure 19:
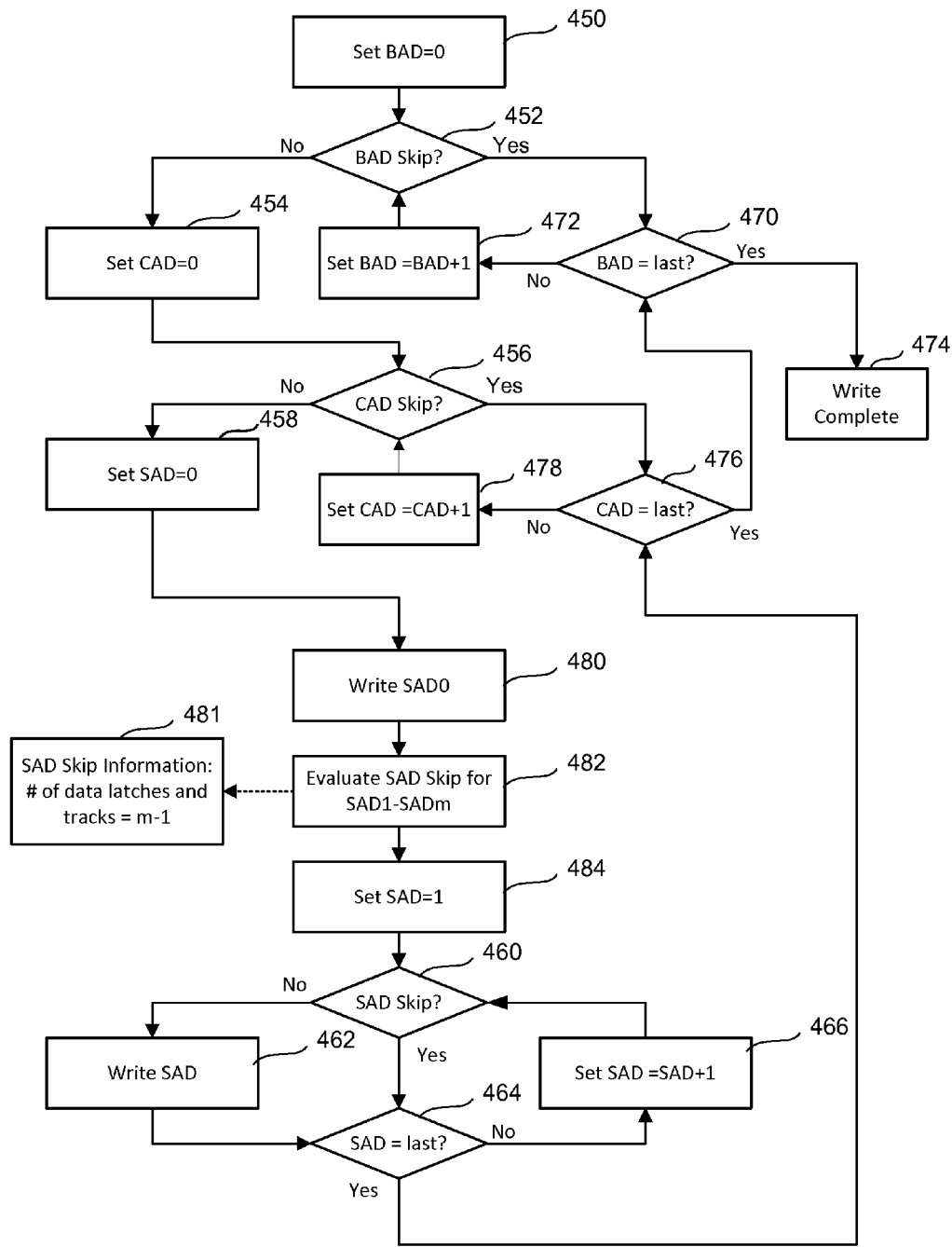
FIG. 19 is a flowchart describing a processing for writing user data in accordance with one embodiment and evaluating sense amp address cycle skipping.

FIG. 19 is a flowchart describing a method of programming user data using skip information corresponding to the embodiment of FIG. 17. In one embodiment, the process of FIG. 19 can be performed at steps 412 and 430 of FIG. 17. Processing initially proceeds as described in FIG. 16. The BAD and CAD skip information is used at steps 452 and 456 to determine whether particular BAD cycles can be skipped and whether CAD cycles within non-skippable BAD cycles can be skipped. The BAD cycles are skipped if possible at step 452 and the BAD cycle incremented at step 472 until a non-skippable BAD cycle is detected. The CAD cycles are skipped at step 456 if possible and the CAD cycle is incremented at step 478 until a non-skippable CAD cycle is detected.

Once a non-skippable CAD cycle is detected, the state machine sets the SAD cycle to SAD0 at step 458. The state machine then writes the user data for SAD0 of the current CAD cycle at step 480. While writing the user data for SAD0, the state machine evaluates SAD skip information for SAD cycles SAD1-SADm of the current CAD cycle. In one embodiment, the state machine reads the data from the other SAD cycles while programming SAD0. In another embodiment, the state machine accesses the data read at step 404 of FIG. 17 and compares that data to be programmed for the SAD cycle. It is noted that the state machine evaluates the skip information for all of the remaining SAD cycles during the first SAD cycle SAD0. The state machine writes the appropriate information into data latches of register 139 for SAD skipping at step 482. In one example, the state machine writes or maintains a '1' in a data latch to indicate the corresponding SAD cycle can be skipped and writes or maintains a '0' in the data latch if the corresponding SAD cycle cannot be skipped. As FIG. 19 denotes in box 481, the total number of data latches needed to store the SAD cycle skip information is equal to one less than the number m of the of SAD cycles. The number is one less than the number of cycles since no data latch is required for storing skip information for SAD0. The number of tracks for transferring the bit map data is also equal to m−1. If a pipelined architecture is used, the number of data latches and the number of tracks will be equal to two less than the number m of SAD cycles.

After generating the skip information for SAD cycles SAD1-SADm, the state machine sets the SAD cycle to SAD1 at step 484. At step 460, processing resumes as described in FIG. 16. The state machine accesses the data latch for SAD1 to determine whether it can be skipped for the current CAD cycle. If so, the state machine determines whether the current SAD cycle is the last at step 464. If the current SAD cycle is not the last, the state machine increments the SAD cycle by one at step 466 and then accesses the skip information for the new SAD cycle at step 460. When a non-skippable SAD cycle is detected, the state machine performs the write operation for the SAD cycle at step 462, then proceeds to step 464. When the last SAD cycle for the current CAD cycle is detected, the state machine checks whether the CAD cycle is the last. If it is not, the CAD cycle is incremented at step 478 and then step 456 is repeated. If the CAD cycle is the last, the state machine determines whether the BAD cycle is the last at step 470. If the current BAD cycle is the last, the state machine completes the write operation at step 474. If the BAD cycle is not the last, the state machine increments the BAD cycle by one and repeats step 452 for the new BAD cycle.

Figure 20:
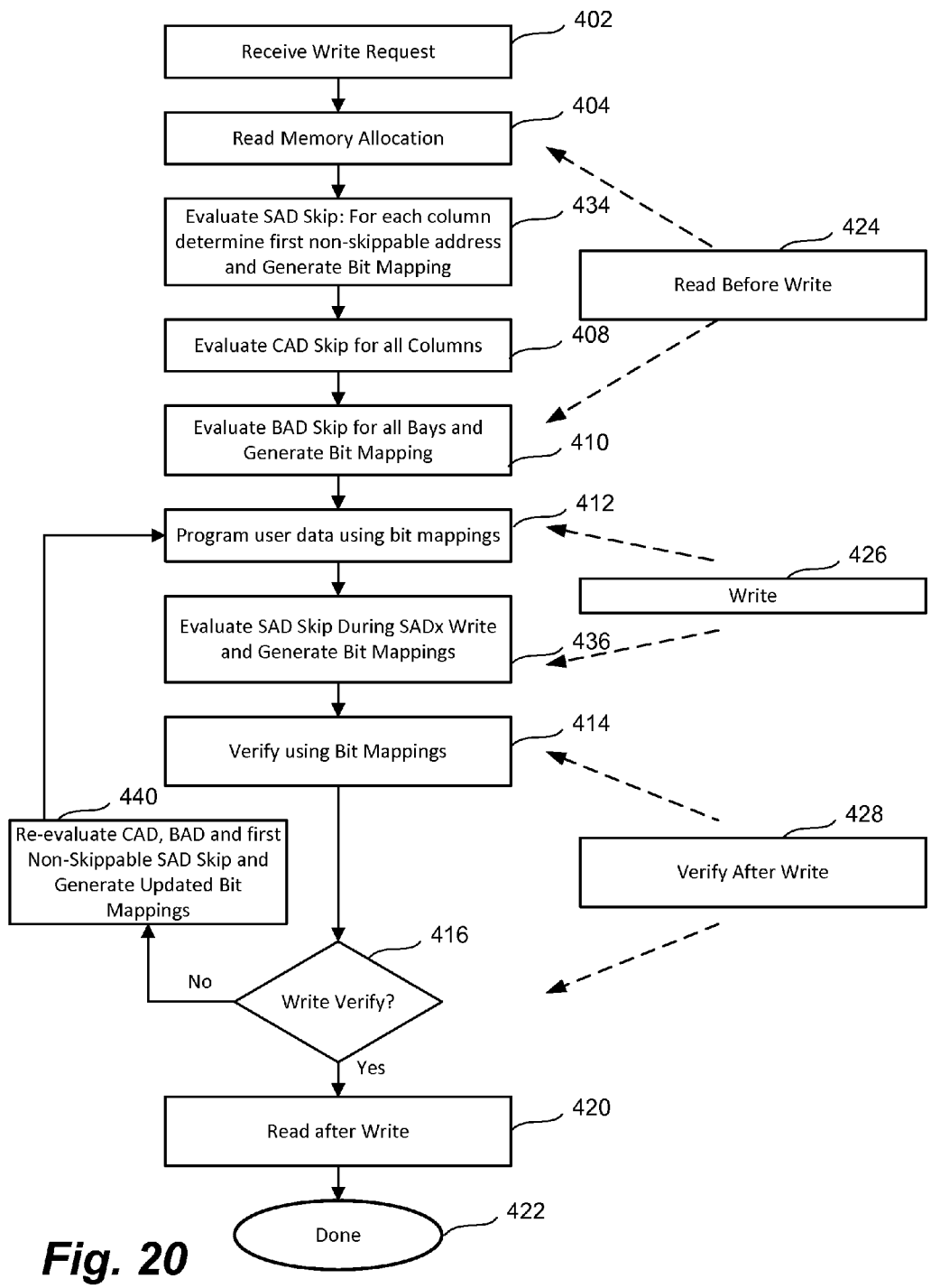
FIG. 20 is a flowchart describing a process for programming non-volatile storage in one embodiment.

FIG. 20 is a flowchart describing one embodiment for programming user data using skip information. In this embodiment, a portion of the skip evaluation is performed during a read before write operation and another portion of the skip evaluation is performed during the write operation itself. The process begins as earlier described by receiving a write request at step 402. A read before write operation 424 begins at step 404 by reading a corresponding memory allocation from the memory array. While reading the memory allocation, an SAD cycle skip evaluation is performed at step 434, a CAD skip evaluation is performed at step 408 and a BAD skip evaluation is performed at step 410. The skip evaluation at step 434 determines for each non-skippable column, the first non-skippable sense amp address for that column. The state machine will disregard the skippable SAD cycles within the CAD cycle. Once the first non-skippable SAD cycle is detected, the state machine writes the actual address for the SAD of the SAD cycle into a data latch of register 139 at step 434. The state machine evaluates the CAD cycle skip information for all columns at step 408 and the BAD cycle skip information for all BAD cycles at step 410. Steps 434, 408 and 410 can be performed in various orders and may overlap.

At step 412, the state machine begins the write operation 426 by programming the user data to the memory array using the bit map data from steps 434, 408 and 410. The state machine skips any skippable BAD cycles and any skippable CAD cycles. When the state machine detects a non-skippable CAD cycle within a non-skippable BAD cycle, it determines the first non-skippable SAD for the CAD using the bit map information written to the data latches at step 434. The state machine will then perform the write operation for the first non-skippable SAD cycle of the column. The first non-skippable SAD cycle is denoted by the address SADx in FIG. 20. While the state machine is writing user data for the first non-skippable SAD cycle, it evaluates the SAD skip information for the remaining SAD cycles of the CAD cycle that follow the first non-skippable SAD cycle. The state machine can write an indication into data latches for the remaining SAD cycles to indicate whether they can be skipped as described in FIG. 17 for SAD(x+1)-SADm. After evaluating the remaining SAD cycles for the CAD cycle, the state machine programs the user data for the SAD cycles using the bit map data. If a SAD cycle can be skipped, the state machine will skip it and only write user date for the non-skippable SAD cycles within the column that follow the first non-skippable SAD cycle.

After programming the user data using the bit map data, including generating the skip information at step 436, the state machine verifies programming of the user data using the bit map data at step 414 as earlier described. If the user data is verified at step 420, the write operation is completed at step 422. If the user data is not verified at step 416, the state machine re-evaluates the skip information at step 440. Step 440 includes re-evaluating the CAD and BAD skip information and generating updated bit map information. Step 440 also includes determining the first non-skippable SAD cycle for each non-skippable CAD cycle and writing the first non-skippable SAD for the SAD cycle into a data latch for that column. In one embodiment, step 440 is performed dynamically as the data is read and verified at step 414.

Figure 21:
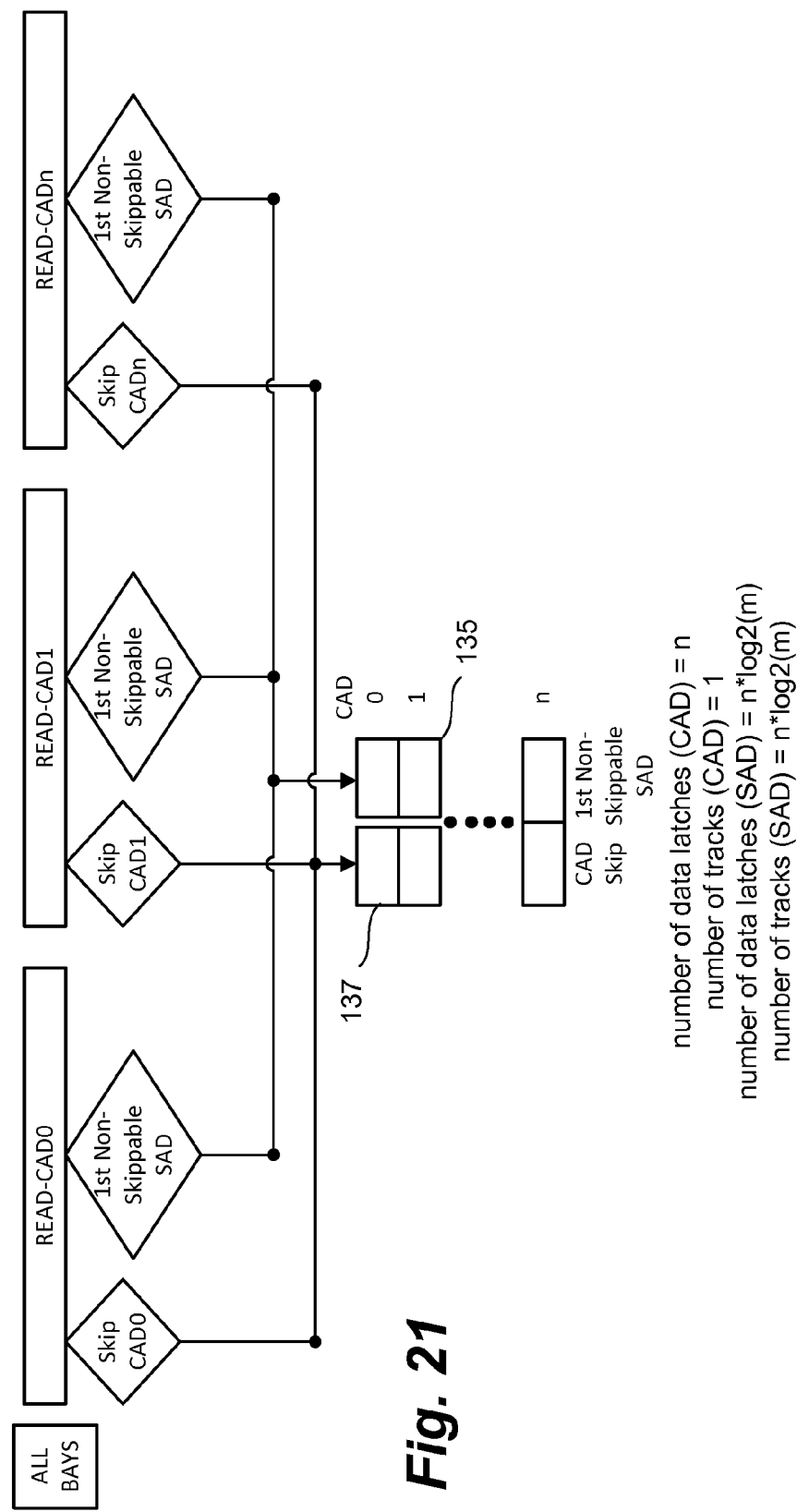
FIG. 21 is a block diagram depicting data latches and a process for generating bitmap data for column address cycle skipping using non-skippable sense amplifier address information.

FIG. 21 is a block diagram describing a process for evaluating CAD and SAD skipping and generating bit map information in accordance with the embodiment of FIG. 20. For each CAD cycle, the state machine determines from the memory data read at step 404 whether the CAD cycle can be skipped. If a CAD cycle can be skipped, the state machine updates or maintains an indication in a data latch in register 137 for the CAD cycle to indicate that it can be skipped. If the state machine determines that a particular CAD cycle cannot be skipped, it determines the first non-skippable SAD within the column. The state machine then writes the address of the first non-skippable SAD into a set of data latches. As FIG. 21 sets forth, the number of data latches needed to store the CAD skip information is equal to the number n of column address cycles. The number of tracks for transferring the CAD bit map data is one. The number of data latches needed to store the SAD skip information for one column is equal to ($\log_2 m$) since the data latches are storing the actual address corresponding to the SAD cycle. The number of tracks for transferring the SAD bitmap data is also $\log_2 m$. Accordingly, the total number of data latches needed to store the CAD and SAD skip information during the read before write operation is equal to the product of the number n of column address cycles and ($1+\log_2 m$) where m is equal to the number of SAD cycles. The process of evaluating BAD skip information is the same as described in FIG. 15.

FIG. 21 shows the data latch configuration for a non-pipelined architecture. Other embodiments may be implemented in a pipelined architecture where two columns are written for each individual CAD. These columns are typically referred to as a top column and a bottom column. In a pipelined architecture for instance, the number of data latches needed to store the CAD skip information is equal to (n*2) where n is the number of CAD cycles. The number of tracks is equal to two. The number of data latches needed to store the SAD for one column is equal to ($\log_2(m/2)$), where m is equal to the number of SAD cycles. The number of tracks is also $\log_2(m/2)$. Thus, the total number of data latches needed to store the CAD and SAD skip information is equal to $(n*2)*(1+\log_2(m/2))$.

Figure 22:
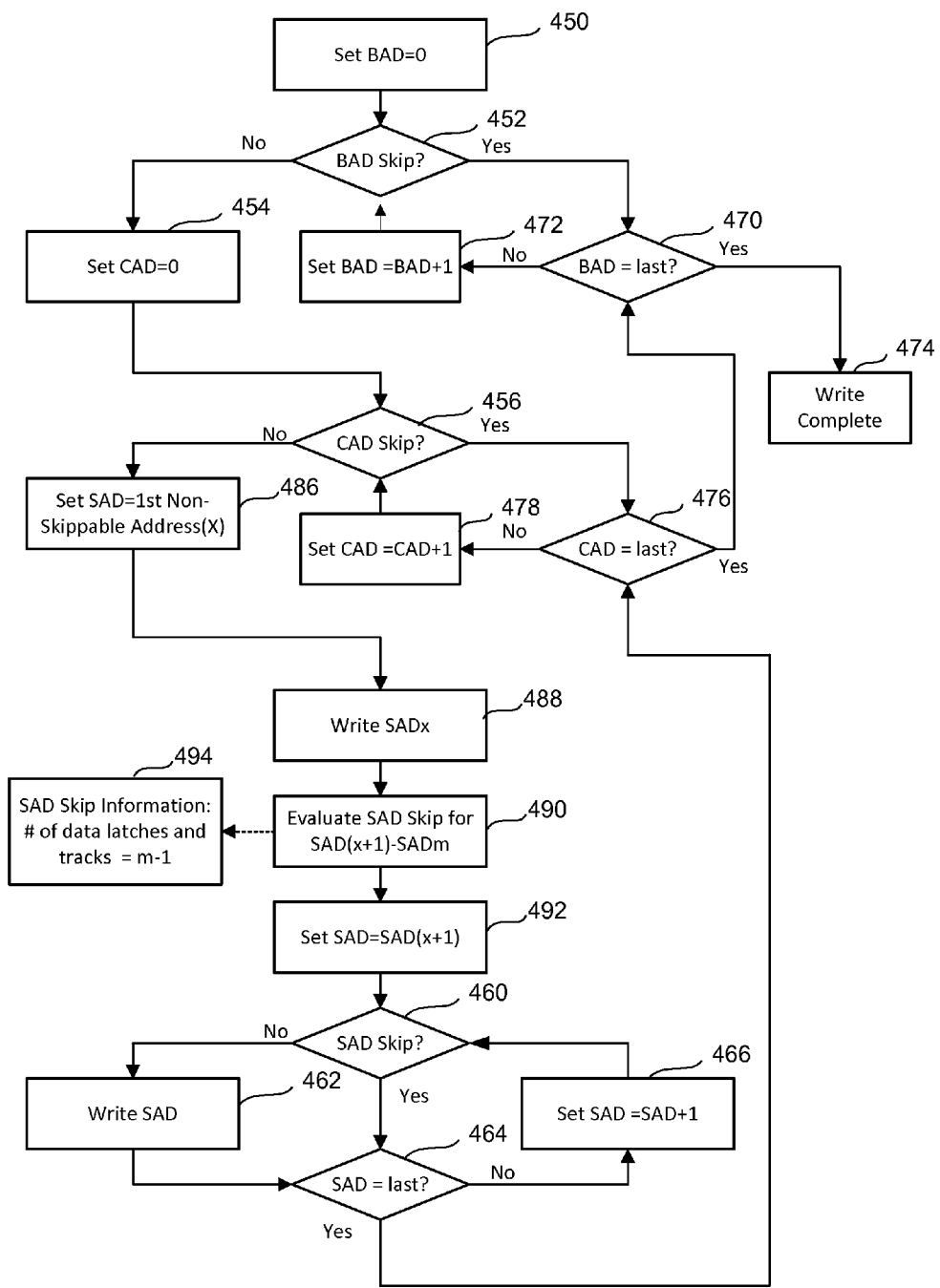
FIG. 22 is a flowchart describing a processing for writing user data in accordance with one embodiment using non-skippable sense amplifier address information.

FIG. 22 is a flowchart describing a process of programming user data using bit map data as can be performed at steps 412 and 436 of FIG. 20 in one example. The state machine sets the BAD cycle to BAD0 at step 450. Steps 452, 470 and 472 are performed as described earlier for BAD cycle processing.

When a non-skippable BAD cycle is detected, the state machine sets the CAD cycle to CAD0 at step 454 and determines whether a data latch for the CAD cycle indicates the CAD cycle should be skipped at step 456. If the CAD cycle can be skipped, the state machine does not program the user information for the CAD cycle. At step 476, the state machine determines whether the CAD cycle is the last. If not, the state machine increments the CAD cycle by one at step 478 and evaluates skip information for the new CAD cycle at step 456. When the state machine detects a non-skippable CAD cycle from the bitmap data in register 137, it sets the SAD cycle to the first non-skippable SAD cycle of the CAD cycle at step 486. The state machine will access data latches in register 137 that store the address for SADx, the first non-skippable SAD cycle of the CAD cycle. The data latches store the actual address of the first non-skippable SAD cycle in this embodiment. Rather than indicate whether or not an SAD cycle can be skipped, the data latches store the actual address of the first non-skippable SAD for the CAD cycle. In this manner, the state machine automatically skips programming for every SAD cycle before the first non-skippable SAD cycle. No SAD skip information are stored for this indication. Instead, the data latches store the actual address of the first non-skippable SAD of the CAD cycle. The first non-skippable SAD of the CAD cycle is denoted as SADx in FIG. 21. At step 486, the state machine sets the current SAD cycle to the first non-skippable SAD cycle SADx of the CAD cycle.

At step 488, the state machine writes the user data for the first non-skippable SAD cycle SADx. While writing the user data for SADx at step 488, the state machine evaluates the skip information for the remaining SAD cycles within the CAD cycle at step 490. The state machine evaluates the skip information for the first SAD cycle SAD(x+1) following the first non-skippable SAD through the last SAD cycle SADm of the CAD cycle.

As shown in box 494, the number of data latches for storing the skip information for the remaining SAD cycles is equal to one less than the total number m of SAD cycles within a CAD cycle. It is possible that the first non-skippable SAD cycle of a CAD cycle will be the first cycle. In that case, the evaluation at step 490 will be for every SAD cycle except the first SAD cycle SAD0. Accordingly, the number of data latches to store all but the first SAD cycle skip information is equal to one less than the total number m. In a pipelined architecture, the number of data latches to store the SAD bitmap data is m−2.

After writing the user data to SADx at step 488 and evaluating the skip information for SAD(x+1) to SADm at step 490, the state machine sets SAD equal to SAD(x+1) at step 492. At step 460, the state machine evaluates from the skip information generated at step 490 whether the current SAD cycle should be skipped. If the SAD cycle cannot be skipped, the state machine writes the user data for the SAD cycle at step 462. After writing the user data at step 462 or determining that the SAD cycle can be skipped, the state machine determines whether the SAD cycle is the last. If the SAD cycle is not the last, the state machine sets SAD to SAD+1 at step 466 and checks the skip information at step 460. If the SAD cycle is the last for the CAD cycle, the state machine returns to step 476 to determine if the current CAD cycle is the last. If the CAD cycle is the last, the state machine returns to step 470 to determine if the current BAD cycle is the last.

Accordingly, a non-volatile memory system has been disclosed comprising a non-volatile memory array, a set of data latches and one or more control circuits in communication with the plurality of non-volatile storage elements and the set of data latches. The one or more control circuits identifies a set of bay address cycles for writing a set of user data for a write request to a set of non-volatile storage elements in the non-volatile memory array. The one or more control circuits compares memory data read from the set of non-volatile storage elements to the set of user data and generates bitmap data identifying whether individual bay address cycles of the set of bay address cycles can be skipped during programming for the set of user data, the one or more control circuits stores the bitmap data in the set of data latches.

A method of programming non-volatile storage has been disclosed that comprises receiving a request to write a set of user data to a non-volatile memory array, identifying a set of non-volatile storage elements from the non-volatile memory array for writing the set of user data and a set of bay address cycles for writing the set of user data to the set of non-volatile storage elements, reading memory data from the set of non-volatile storage elements prior to writing the set of user data, comparing the memory data to the set of user data to determine whether any bay address cycles of the set can be skipped, and programming the set of user data to the set of non-volatile storage elements based on comparing the memory data to the set of user data.

A method of programming non-volatile storage has been disclosed that comprises receiving a request to write a set of user data to a non-volatile memory array, identifying a set of non-volatile storage elements from the non-volatile memory array for writing the set of user data, identifying a set of bay address cycles, a set of column address cycles and a set of sense amp address cycles for writing the set of user data to the set of non-volatile storage elements, reading memory data from the set of non-volatile storage elements during a read before write operation prior to writing the set of user data, comparing the memory data to the set of user data to determine whether any bay address cycles, column address cycles and sense amp address cycles can be skipped, and programming the set of user data to the set of non-volatile storage elements based comparing the memory data to the set of user data.

A method of programming non-volatile storage has been disclosed that comprises identifying a set of non-volatile storage elements for a request to write a set of user data to a non-volatile memory array using a set of bay address cycles, a set of column address cycles, and a set of sense amp address cycles. The method comprises, prior to writing the set of user data, comparing memory data from the set of non-volatile storage elements to the set of user data to determine whether any bay address cycles and any column address cycles can be skipped. The method comprises determining that a first column address cycle of a first bay address cycle should not be skipped, and programming the first set of data to the set of non-volatile storage elements. The programming includes writing a portion of the set of user data during a first sense amp address cycle of the first column address cycle and while writing the portion of the set of user data during the first sense amp address cycle, evaluating whether a plurality of additional sense amp cycles of the first column address cycle can be skipped.

A method of programming non-volatile storage has been disclosed that comprises identifying a set of non-volatile storage elements in response to a request to write a set of user data to a non-volatile memory array using a set of bay address cycles, a set of column address cycles, and a set of sense amp address cycles. The method comprises, prior to writing the set of user data, comparing memory data from the set of non-volatile storage elements to the set of user data to determine whether any bay address cycles and column address cycles can be skipped. The method comprises determining that a first column address cycle of a first bay address cycle should not be skipped, determining a first sense amp address cycle of the first column address cycle that should not be skipped, storing an identifier for the first sense amp address cycle prior to writing the set of user data, and programming the first set of data to the set of non-volatile storage elements based on the evaluation. The programming includes writing a portion of the set of user data during the first sense amp address cycle of the first column address signal, and while writing the portion of the set of user data during the first sense amp address cycle, evaluating whether a plurality of additional sense amp cycles of the first column address cycle can be skipped. The method comprises storing skip information for the plurality of additional sense amplifier cycles and programming a remaining portion of the set of user data for the first column address cycle based on the skip information for the plurality of additional sense amplifier cycles.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile storage, comprising:
   receiving a request to write a set of user data to a non-volatile memory array;
   identifying a set of non-volatile storage elements from the non-volatile memory array for writing the set of user data and a set of bay address cycles for writing the set of user data to the set of non-volatile storage elements;
   reading memory data from the set of non-volatile storage elements prior to writing the set of user data;
   comparing the memory data to the set of user data to determine whether any bay address cycles of the set should be skipped; and
   programming the set of user data to the set of non-volatile storage elements based on comparing the memory data to the set of user data.

2. A method according to claim 1, wherein comparing the memory data to the set of user data is performed during a read before write operation that is executed prior to writing any of the set of user data.

3. A method according to claim 2, further comprising:
   storing in a set of data latches during the read before write operation information associated with comparing the memory data to the set of user data to determine whether any bay address cycles of the set should be skipped, the set of data latches including a data latch for each bay address cycle, each data latch storing an indication of whether a corresponding bay address cycle should be skipped.

4. A method according to claim 3, wherein:
identifying a set of bay address cycles includes identifying a set of column address cycles and a set of sense amp address cycles for writing the set of user data to the set of non-volatile storage elements;
comparing the memory data to the set of user data includes comparing the memory data to the set of user data to determine whether any column address cycles and any sense amp address cycles should be skipped; and
programming the first set of data to the set of non-volatile storage elements is based on whether any column address cycles and any sense amp address cycles should be skipped.

5. A method according to claim 4, further comprising:
storing in the set of data latches during the read before write operation information associated with any column address cycles and sense amp addresses of the set should be skipped, the set of data latches including a data latch for each sense amplifier address cycle indicating whether the each sense amplifier address cycle that should be skipped.

6. A method according to claim 3, wherein:
identifying a set of bay address cycles includes identifying a set of column address cycles;
comparing the memory data to the set of user data includes comparing the memory data to the set of user data to determine whether any column address cycles should be skipped; and
programming the first set of data to the set of non-volatile storage elements is based on whether any column address cycles should be skipped.

7. A method according to claim 6, further comprising:
storing in the set of data latches during the read before write operation information associated with any column address cycles of the set that should be skipped.

8. A method according to claim 7, wherein programming the set of user data includes:
determining from the set of data latches that a first column address cycle should not be skipped;
in response to determining that first column address cycle should not be skipped, programming a first sense amplifier address cycle of the first column address cycle; and
while programming the first sense amplifier address cycle, evaluating whether additional sense amplifier address cycles of the first column address cycle should be skipped.

9. A method according to claim 7, further comprising:
for each column address cycle that should be skipped, storing in the set of data latches during the read before write operation an identifier of a first sense amplifier address cycle of the column address cycle that should not be skipped.

10. A method according to claim 9, wherein programming the set of user data includes:
determining from the set of data latches that a first column address cycle should not be skipped;
in response to determining that that first column address cycle should not be skipped, programming the first sense amplifier address cycle of the first column address cycle based on the identifier; and
while programming the first sense amplifier address cycle, evaluating whether additional sense amplifier address cycles of the first column address cycle should be skipped.

11. A method according to claim 1, wherein:
programming the set of user data to the set of non-volatile storage elements comprises writing less than all of the set of user data to the set of non-volatile storage elements by skipping at least one bay address cycle of the set.

12. A method according to claim 11, wherein:
the set of bay address cycles includes a first bay address cycle associated with a subset of non-volatile storage element from the set of non-volatile storage elements;
comparing the memory data to the set of user data comprises determining whether a subset of the set of user data corresponding to the first bay address cycle matches a subset of the memory data read from the subset of non-volatile storage elements;
programming the set of user data comprises writing the subset user data to the subset of non-volatile storage elements if the subset of user data does not match the subset of memory data; and
programming the set of user data comprises skipping the first bay address cycle and not writing the subset of user data if the subset user data matches the subset of memory data.

13. A method according to claim 1, wherein the non-volatile memory array is a three dimensional non-volatile memory array.

14. A non-volatile memory system, comprising:
a non-volatile memory array;
a set of data latches;
one or more control circuits in communication with the plurality of non-volatile storage elements and the set of data latches, the one or more control circuits configured to identify a set of bay address cycles for writing a set of user data for a write request to a set of non-volatile storage elements in the non-volatile memory array, the one or more control circuits configured to compare memory data read from the set of non-volatile storage elements to the set of user data and generate bitmap data identifying whether individual bay address cycles of the set of bay address cycles should be skipped during programming for the set of user data, the one or more control circuits are configured to store the bitmap data in the set of data latches.

15. A non-volatile memory system according to claim 14, wherein the one or more control circuits configured to compare the memory data to the set of user data during a read before write operation that is executed prior to writing any user data of the set of user data.

16. A non-volatile memory system according to claim 15, wherein:
the bitmap data is first bitmap data;
the one or more control circuits configured to identify a set of column address cycles for writing the set of user data for the write request and generate second bitmap data identifying whether individual column address cycles of the set of column address cycles can should be skipped during programming for the set of user data, the one or more control circuits configured to store the second bitmap data in the set of data latches.

17. A non-volatile memory system according to claim 16, wherein:
the one or more control circuits configured to identify a set of sense amp address cycles for writing the set of user data for the write request including a first sense amp address cycle of a first column address cycle, the one or more control circuits configured to determine that the first column address cycle should not be skipped and that the first sense amplifier address cycle should not be skipped, the one or more control circuits configured to store an identifier of the first sense amplifier address cycle in the set of data latches.

18. A non-volatile memory system according to claim 17, wherein:
the one or more control circuits are configured to program user data for the first sense amplifier address cycle; and
the one or more control circuits configured to generate bitmap data for each sense amplifier address cycle of the first column address cycle that follows the first sense amplifier address cycle while programming the first sense amplifier address cycle.

19. A non-volatile memory system according to claim 14, wherein:
the one or more control circuits includes a state machine and a page register, the page register configured to store the set of user data prior to writing to the set of user data to the non-volatile memory array.

20. A non-volatile memory system according to claim 14, wherein the non-volatile memory array is a three dimensional non-volatile memory array.

21. A method of programming non-volatile storage, comprising:
receiving a request to write a set of user data to a non-volatile memory array;
identifying a set of non-volatile storage elements from the non-volatile memory array for writing the set of user data;
identifying a set of bay address cycles, a set of column address cycles and a set of sense amp address cycles for writing the set of user data to the set of non-volatile storage elements;
reading memory data from the set of non-volatile storage elements during a read before write operation prior to writing the set of user data;
comparing the memory data to the set of user data to determine whether any bay address cycles, column address cycles and sense amp address cycles should be skipped; and
programming the set of user data to the set of non-volatile storage elements based comparing the memory data to the set of user data.

22. A method of programming non-volatile storage, comprising:
identifying a set of non-volatile storage elements for a request to write a set of user data to a non-volatile memory array using a set of bay address cycles, a set of column address cycles, and a set of sense amp address cycles;
prior to writing the set of user data, comparing memory data from the set of non-volatile storage elements to the set of user data to determine whether any bay address cycles and any column address cycles should be skipped;
determining that a first column address cycle of a first bay address cycle should not be skipped;
programming the first set of data to the set of non-volatile storage elements, said programming includes writing a portion of the set of user data during a first sense amp address cycle of the first column address cycle; and
while writing the portion of the set of user data during the first sense amp address cycle, evaluating whether a plurality of additional sense amp cycles of the first column address cycle should be skipped.

23. A method according to claim 22, wherein comparing the memory data to the set of user data is performed during a read before write operation that is executed prior to writing any user data of the set of user data, the method further comprising;
storing in a set of data latches during the read before write operation an indication of whether each bay address cycle should be skipped;
storing in the set of data latches during the read before write operation an indication of whether each column address cycle should be skipped; and
storing in the set of data latches an indication of whether the plurality of additional sense amp cycles of the first column address cycle should be skipped, wherein said storing is performed during programming for the first set of data.

24. A method according to claim 23, wherein the portion of the set of user data is a first portion and programming the set of user data includes:
writing a second portion of the first set of data during a second sense amplifier address cycle of the first column address cycle based on an indication in the set of data latches that the second sense amplifier address cycle should not be skipped;
skipping writing of a third portion of the first set of data during a third sense amplifier address cycle of the first column address cycle based on an indication in the set of data latches that the third sense amplifier address cycle should be skipped.

25. A method according to claim 24, wherein the first sense amp address cycle is performed prior to the plurality of additional sense amp cycles.

26. A method of programming non-volatile storage, comprising:
identifying a set of non-volatile storage elements in response to a request to write a set of user data to a non-volatile memory array using a set of bay address cycles, a set of column address cycles, and a set of sense amp address cycles;
prior to writing the set of user data, comparing memory data from the set of non-volatile storage elements to the set of user data to determine whether any bay address cycles and column address cycles should be skipped;
determining that a first column address cycle of a first bay address cycle should not be skipped;
determining a first sense amp address cycle of the first column address cycle that should not be skipped;
storing an identifier for the first sense amp address cycle prior to writing the set of user data;
programming the first set of data to the set of non-volatile storage elements based on the evaluation, said programming includes writing a portion of the set of user data during the first sense amp address cycle of the first column address cycle;
while writing the portion of the set of user data during the first sense amp address cycle, evaluating whether a plurality of additional sense amp cycles of the first column address cycle should be skipped;
storing skip information for the plurality of additional sense amplifier cycles; and
programming a remaining portion of the set of user data for the first column address cycle based on the skip information for the plurality of additional sense amplifier cycles.

27. A method according to claim 26, further comprising:
storing in a set of data latches during a read before write operation an indication of whether each bay address cycles of the set should be skipped; and storing in the set of data latches during the read before write operation an indication of whether each column address cycles of the set should be skipped;

wherein storing the identifier includes storing an address for the first sense amplifier address cycle in the set of data latches during the read before write operation.

\* \* \* \* \*